(12) United States Patent
Kwon et al.

(10) Patent No.: US 12,218,086 B2
(45) Date of Patent: Feb. 4, 2025

(54) SEMICONDUCTOR PACKAGE AND METHOD OF MANUFACTURING SAME

(71) Applicant: SAMSUNG ELECTRONICS CO., LTD., Suwon-si (KR)

(72) Inventors: Yongbum Kwon, Yongin-si (KR); Unbyoung Kang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 484 days.

(21) Appl. No.: 17/716,054

(22) Filed: Apr. 8, 2022

(65) Prior Publication Data

US 2023/0061418 A1    Mar. 2, 2023

(30) Foreign Application Priority Data

Aug. 26, 2021    (KR) .................. 10-2021-0113348

(51) Int. Cl.
*H01L 23/00* (2006.01)
*H01L 21/768* (2006.01)

(52) U.S. Cl.
CPC ........ *H01L 24/03* (2013.01); *H01L 21/76802* (2013.01); *H01L 21/76898* (2013.01); *H01L 24/08* (2013.01); *H01L 24/80* (2013.01); *H01L 2224/02313* (2013.01); *H01L 2224/03011* (2013.01); *H01L 2224/033* (2013.01); *H01L 2224/0355* (2013.01); *H01L 2224/08145* (2013.01); *H01L 2224/80895* (2013.01)

(58) Field of Classification Search
CPC ............... H01L 24/03; H01L 21/76802; H01L 21/76898; H01L 24/08; H01L 24/80; H01L 2224/02313; H01L 2224/03011; H01L 2224/033; H01L 2224/0355; H01L 2224/08145; H01L 2224/80895; H01L 24/83; H01L 21/76843; H01L 21/76865; H01L 21/7684

See application file for complete search history.

(56) References Cited

U.S. PATENT DOCUMENTS 6,051,496 A   4/2000   Jang
6,103,625 A   8/2000   Marcyk et al.
(Continued)

*Primary Examiner* — Latanya N Crawford Eason
(74) *Attorney, Agent, or Firm* — Fish & Richardson P.C.

(57) ABSTRACT

A method of manufacturing a semiconductor package includes bonding first the and second structures, such that a first bonding structure is directly bonded to a second bonding structure. The forming of the first structure includes; forming a blocking layer on a metallic material layer including a first portion covering a concaved portion of the metallic material layer and a second portion covering a non-concaved portion of the metallic material layer, performing a first planarization process to remove the second portion of the blocking layer while the first portion of the blocking layer remains, performing a second planarization process to remove the non-concaved portion of the metallic material layer and expose the barrier layer on the insulating layer, performing a wet etching process to remove the barrier layer on the insulating layer and the blocking layer to form the first bonding pad including the barrier layer in the opening and the metallic material layer and forming a recessed portion below an upper surface of the metallic material layer on the barrier layer while removing the barrier layer on the insulating layer.

20 Claims, 19 Drawing Sheets

(56) References Cited

U.S. PATENT DOCUMENTS

| | | | |
|---|---|---|---|
| 6,169,028 B1 | 1/2001 | Wang et al. | |
| 6,391,780 B1 | 5/2002 | Shih et al. | |
| 6,716,743 B2 | 4/2004 | Nagashima | |
| 7,030,019 B2 | 4/2006 | Kawasaki | |
| 7,372,160 B2 | 5/2008 | Spinner, III et al. | |
| 10,446,441 B2 | 10/2019 | Uzoh | |
| 11,562,975 B2 * | 1/2023 | Hou | H01L 24/17 |
| 2020/0168471 A1 * | 5/2020 | Jang | H01L 27/14634 |

* cited by examiner

SEMICONDUCTOR PACKAGE AND METHOD OF MANUFACTURING SAME

CROSS-REFERENCE TO RELATED APPLICATION

This application claims priority under 35 U.S.C. § 119 to Korean Patent Application No. 10-2021-0113348 filed on Aug. 26, 2021 in the Korean Intellectual Property Office, the subject matter of which is hereby incorporated by reference in its entirety.

BACKGROUND

The inventive concept relates generally to semiconductor packages and methods of manufacturing same.

Continuing semiconductor trends providing improved performance and reduced physical size motivate ongoing research and development into system-in-package (SiP) technologies, wherein multiple semiconductor chips of potentially different type(s) are integrated within a single semiconductor package. For example, certain technologies facilitating the formation of very fine interconnections between semiconductor chips, components and/or elements in a semiconductor package may provide through-silicon via(s) (TSV) bonded to each other through bonding pad(s).

SUMMARY

Embodiments of the inventive concept provide semiconductor packages exhibiting improved electrical performance and improved reliability. Other embodiments of the inventive concept provide method of manufacturing same.

According to an embodiment, a method of manufacturing a semiconductor package may include; preparing a semiconductor structure including a semiconductor layer and a through-via penetrating through the semiconductor layer, forming an insulating layer on the semiconductor structure, forming an opening in the insulating layer to expose an upper surface of the through-via, forming a barrier layer on the insulating layer to cover the upper surface of the through-via, inner side surfaces of the opening, and an upper surface of the insulating layer, forming a metallic material layer on the barrier layer, wherein the metallic material layer includes a concave portion and a non-concaved portion, forming a blocking layer on the metallic material layer, wherein the blocking layer includes a first portion covering the concaved portion of the metallic material layer and a second portion covering the non-concaved portion of the metallic material layer, performing a first planarization process to remove the second portion of the blocking layer, while the first portion of the blocking layer remains, performing a second planarization process to remove the non-concaved portion of the metallic material layer and expose the barrier layer on the insulating layer, and performing a wet etching process to remove the barrier layer on the insulating layer and the first portion of the blocking layer, wherein a recessed portion below an upper surface of the metallic material layer is formed in the barrier layer during the wet etching process.

According to an embodiment, a method of manufacturing a semiconductor package may include; forming a first structure including a first bonding structure including a first bonding pad, forming a second structure including a second bonding structure including a second bonding pad, and bonding the first structure and the second structure, such that the first bonding structure is directly bonded to the second bonding structure. The forming of the first structure may include; preparing a semiconductor structure including a semiconductor layer and a through-via penetrating the semiconductor layer, forming an insulating layer on the semiconductor layer, forming an opening in the insulating layer exposing an upper surface of the through-via, forming a barrier layer on the insulating layer to cover the upper surface of the through-via, inner side surfaces of the opening and an upper surface of the insulating layer, forming a metallic material layer on the barrier layer, wherein the metallic material layer includes a concave portion and a non-concaved portion, forming a blocking layer on the metallic material layer, wherein the blocking layer includes a first portion covering the concaved portion of the metallic material layer and a second portion covering the non-concaved portion of the metallic material layer, performing a first planarization process to remove the second portion of the blocking layer, while the first portion of the blocking layer remains, performing a second planarization process to remove the non-concaved portion of the metallic material layer and expose the barrier layer on the insulating layer, performing a wet etching process to remove the barrier layer on the insulating layer and the blocking layer to form the first bonding pad including the barrier layer in the opening and the metallic material layer, and forming a recessed portion below an upper surface of the metallic material layer on the barrier layer while removing the barrier layer on the insulating layer.

According to an embodiment, a method of manufacturing a semiconductor package may include; forming a first structure including a first bonding structure including a first bonding pad, forming a second structure including a second bonding structure including a second bonding pad, and bonding the first structure and the second structure, such that the first bonding structure is directly bonded to the second bonding structure. At least one of the forming of the first structure and the forming of the second structure may include; preparing a semiconductor structure including a semiconductor layer and a through-via penetrating the semiconductor layer, forming an insulating layer on the semiconductor layer, forming an opening in the insulating layer exposing an upper surface of the through-via, forming a barrier layer on the insulating layer to cover the upper surface of the through-via, inner side surfaces of the opening and an upper surface of the insulating layer, forming a metallic material layer on the barrier layer, wherein the metallic material layer includes a concave portion and a non-concaved portion, forming a blocking layer on the metallic material layer, wherein the blocking layer includes a first portion covering the concaved portion of the metallic material layer and a second portion covering the non-concaved portion of the metallic material layer, performing a first planarization process to remove the second portion of the blocking layer, while the first portion of the blocking layer remains, performing a second planarization process to remove the non-concaved portion of the metallic material layer and expose the barrier layer on the insulating layer, performing a wet etching process to remove the barrier layer on the insulating layer and the blocking layer to form the first bonding pad including the barrier layer in the opening and the metallic material layer, a recessed portion is formed in the barrier layer while removing the barrier layer on the insulating layer, and a first recessed portion in a first barrier layer of the first bonding pad and a second recessed portion in a second barrier layer of the second bonding pad are respectively spaced apart from a bonding surface between the first bonding pad and the second bonding pad.

According to an embodiment, a semiconductor package may include; a first structure including a first bonding structure including a first bonding pad and a first bonding insulating layer, wherein the first structure includes a first semiconductor layer having a front surface and an opposing back surface, a first circuit layer disposed on the front surface of the first semiconductor layer and including an internal interconnection, and a first through-via penetrating through the first semiconductor layer and connected to the internal interconnection of the first circuit layer; and a second structure disposed on the first structure and including a second bonding structure including a second bonding pad in direct contact with the first bonding pad, and a second bonding insulating layer in direct contact with the first bonding insulating layer, wherein the first bonding structure is disposed on the back surface of the first semiconductor layer, the first bonding pad is disposed in a first opening of the first bonding insulating layer, the first opening exposes at least a portion of the first through-via, the first bonding pad includes a first metallic material layer and a first barrier layer covering side surfaces and a lower surface of the first metallic material layer, and the first barrier layer includes a first recessed portion below an upper surface of the metallic material layer.

BRIEF DESCRIPTION OF DRAWINGS

The above and other aspects, features, and advantages of the inventive concept disclosure may be more clearly understood upon consideration of the following detailed description together with the accompanying drawings, in which.

DETAILED DESCRIPTION

Throughout the written description and drawings, like reference numbers and labels are used to denote like or similar components, elements, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
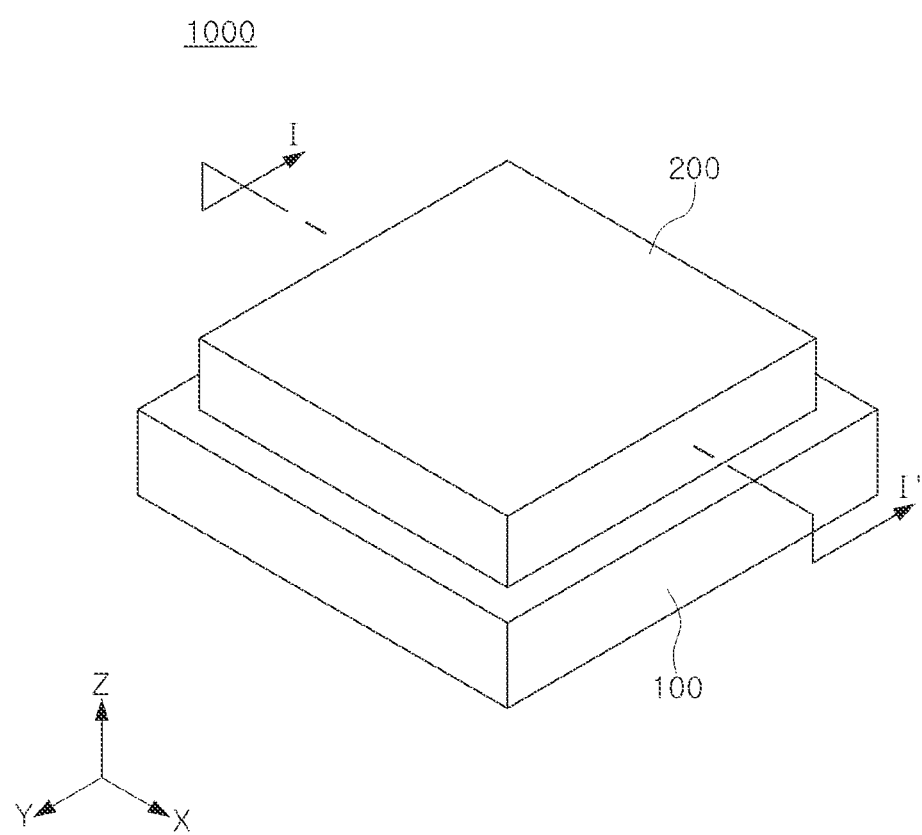
FIG. 1 is a perspective view illustrating a semiconductor package.
Figure 2:
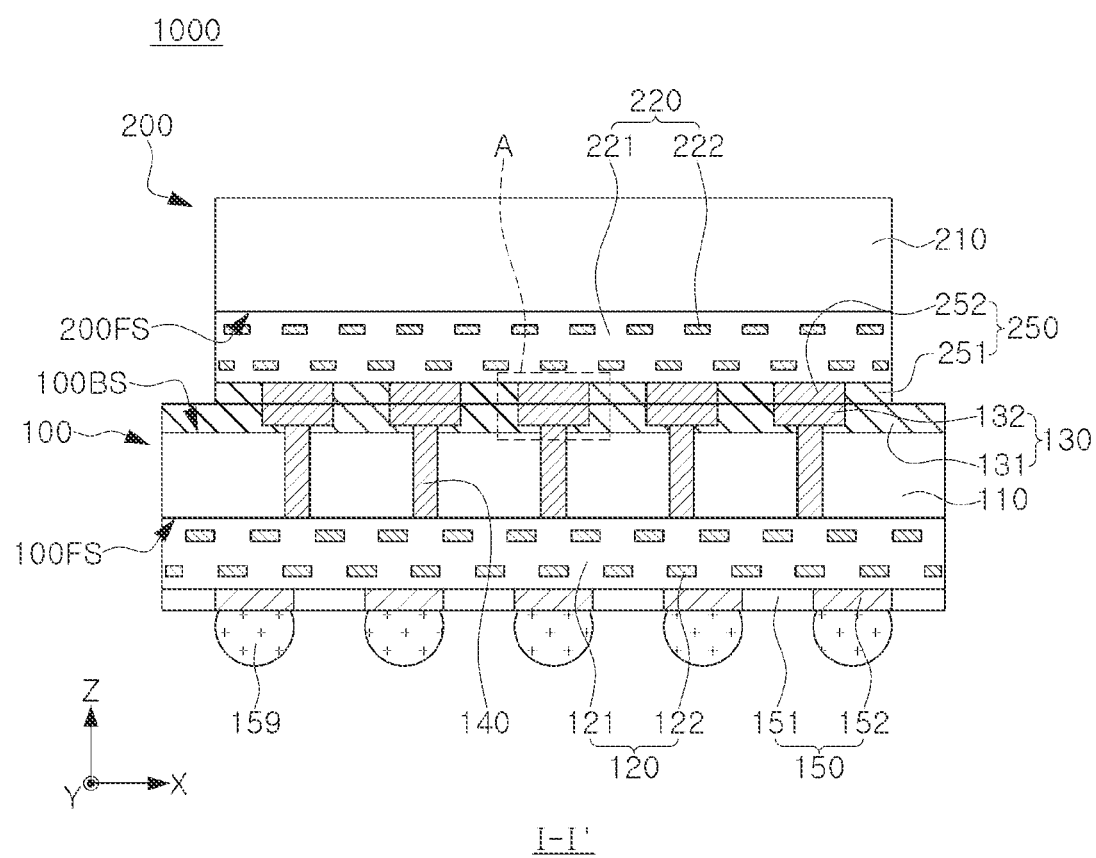
FIG. 2 is a cross-sectional view illustrating a semiconductor package as a comparative example.
Figure 3:
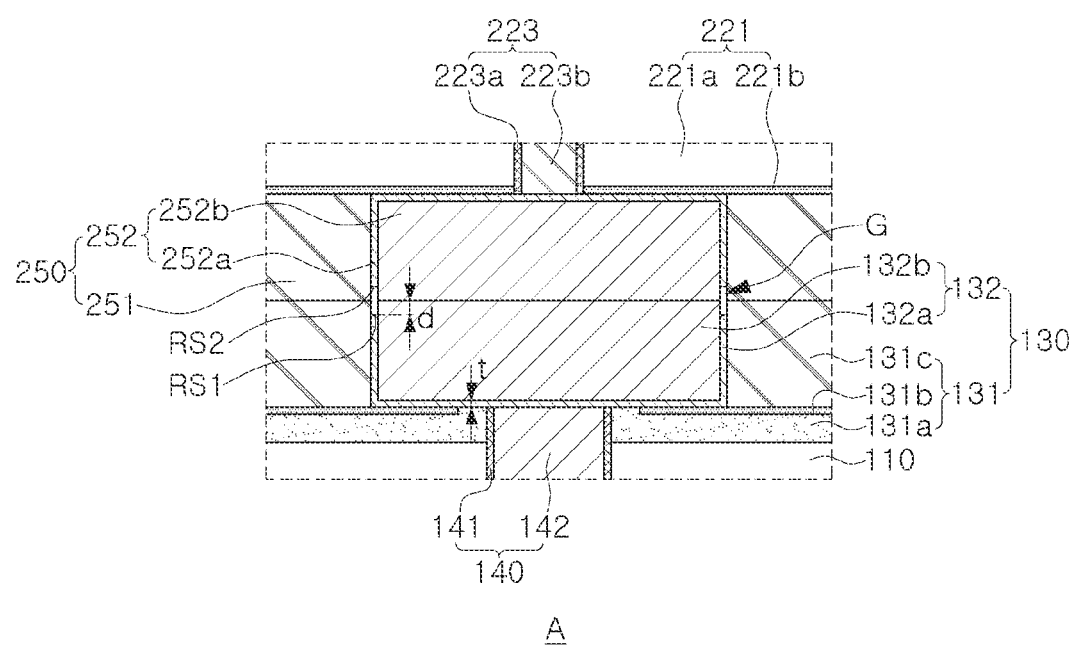
FIG. 3 is an enlarged view of region 'A' indicated in in FIG. 2.

FIG. 1 is a perspective view illustrating a semiconductor package, FIG. 2 is a cross-sectional view of a semiconductor package 1000 presented as a comparative example, and FIG. 3 is an enlarged view of a region 'A' indicated in FIG. 2

Referring to FIGS. 1, 2 and 3, the semiconductor package 1000 may include a semiconductor structure 100 and a semiconductor chip 200 stacked in a vertical (or Z-axis) direction in relation to a horizontal plane defined by a first horizontal (or X-axis) direction and a second horizontal (or Y-axis) direction. Element(s) disposed on an upper surface of the semiconductor structure 100 may be bonded (e.g., connected without additional intervening connection member, such as conductive pillars, conductive bumps, etc.) with element(s) disposed on a lower surface of the semiconductor chip 200. Such bonding techniques may be referred to as hybrid bonding, direct bonding, etc. As examples, dielectric-to-dielectric bonding and copper-to-copper (Cu-to-Cu) bonding techniques may be used to bond respective elements (or interface surfaces of such elements) associated with the semiconductor structure 100 and the semiconductor chip 200. In this regard, a back pad 132 (e.g., a first bonding pad of the semiconductor structure 100) and a front pad 252 (e.g., a second bonding pad of the semiconductor chip 200) may be directly bonded. In this context, the terms "connect", "connected" and connecting denote electrically, structural and/or mechanical connection(s) between devices, components and/or elements.

The semiconductor structure 100 may include a semiconductor layer 110, a circuit layer 120, a back cover layer 130, a through-via 140, and a front cover layer 150. In some embodiments, the semiconductor structure 100 may be a silicon interposer substrate, a semiconductor chip, or the like. In some embodiments wherein the semiconductor structure 100 is a semiconductor chip, the semiconductor structure 100 and the semiconductor chip 200 may be vertically stacked as respective chiplets constituting a multi-chip module (MCM) (See, e.g., the embodiment of FIG. 13).

The semiconductor layer 110 may include at least one semiconductor element such as silicon, germanium, silicon carbide (SiC), gallium arsenide (GaAs), indium arsenide (InAs), indium phosphide (InP), etc.

The circuit layer 120 may be disposed on a front surface 110FS of the semiconductor layer 110, and may include an interlayer insulating layer 121 and internal interconnections 122. The interlayer insulating layer 121 may include at least one of silicon oxide, silicon nitride, and silicon oxynitride.

Here, the internal interconnections 122 may variously redistribute the back pad(s) 132 disposed on the back surface 110BS and/or through-vias 140 to form a multilayer structure variously including interconnection lines and interconnection vias. The interconnection lines and interconnection vias may include at least one of, for example, aluminum (Al), gold (Au), cobalt (Co), copper (Cu), nickel (Ni), lead (Pb), tantalum (Ta), and tellurium (Te), titanium (Ti) and tungsten (W). A barrier layer (not shown)—including for example at least one of titanium (Ti), titanium nitride (TiN), tantalum (Ta), and tantalum nitride (TaN)—may be disposed between interconnection line(s) and/or the interconnection via(s) and the interlayer insulating layer 121.

In some embodiments, the circuit layer 120 may include individual, discrete components (not shown) disposed on the front surface 110FS of the semiconductor layer 110. In such cases, the internal interconnections 122 may be variously connected to the discrete components. Here, the discreate components may include field-effect transistor(s) (FET) (e.g., a planar FET or a FinFET), memory device(s) (e.g., a flash memory, a dynamic random access memory (RAM) (DRAM), a static RAM (SRAM), an electrically erasable programmable read-out memory (EEPROM), a phase-change RAM (PRAM), a magneto-resistive RAM (MRAM), a ferroelectric RAM (FeRAM) and/or a resistive RAM (RRAM)), logic devices (e.g., circuits implementing AND, OR, and/or NOR gates), passive components (e.g., capacitors, resistors and/or inductors), integrated circuits, large scale integration (LSI) circuit, Complementary Metal Oxide Semiconductor (CMOS) imaging sensors (CIS), and a micro-electro-mechanical systems (MEMS).

The back cover layer 130 may be disposed on a back surface 110BS of the semiconductor layer 110, and may include a back insulating layer 131 and back pads 132.

As assembled in the semiconductor structure 1000, the front cover layer 150 may be disposed under (or below) the circuit layer 120. The front cover layer 150 may include a front insulating layer 151 and a front pad 152. The front pad 152 may be connected to the back pad 132 through the internal interconnection 122 and the through-via 140. The front pad 152 may provide a connection terminal through which the semiconductor structure 100 and the semiconductor chip 200 may be connected to one or more external device(s).

An additional connection member 159 (e.g., a solder ball, a copper pillar, or the like) may be disposed below the front pad 152, but example embodiments are not limited thereto.

The front insulating layer 151 and the back insulating layer 131 may include at least one of silicon oxide, silicon nitride, silicon oxynitride, silicon carbide, silicon oxycarbide, and silicon carbonitride. In some embodiments, the front pad 152 and the back pad 132 may be implemented like the internal interconnections 122. The back insulating layer 131 may include an insulating material which may be readily bonded to the front insulating layer 251 of the semiconductor chip 200 (e.g., at least one of, for example, silicon oxide, silicon nitride, silicon oxynitride, silicon carbide, silicon oxycarbide, and silicon carbonitride).

The back pad 132 may include at least one conductive material which may be readily bonded to the front pad 252 of the semiconductor chip 200, such as, for example, Cu, Ni, Au, and Ag. Thus, the back cover layer 130 of the semiconductor structure 100 and the front cover layer 250 of the semiconductor chip 200 may form opposing bonding structures that may be readily bonded. (See. e.g., the embodiment of FIG. 3).

The through-vias 140 may penetrate (or pass) through the semiconductor layer 110 to variously connect the internal interconnections 122. The through-vias 140 may also extend at least partially through the back insulating layer 131 and/or the interlayer insulating layer 121. In some embodiments, the through-vias 140 may variously connect the discrete components (not shown) disposed on the front surface 110FS of the semiconductor layer 110 with the internal interconnections 122 through the circuit layer 120.

As further illustrated in FIG. 3, each of the through-vias 140 may include a through-electrode 142 and a barrier layer 141 substantially surrounding side surfaces of the through-electrode 142. The through-electrode 142 may include at least one of, for example, W, Ti, Al, and Cu. The barrier layer 141 may include at least one conductive material, such as WN, TiN, TaN, etc. A via insulating layer (not shown) may be formed on side surfaces of the through-via 140. Here, the via insulating layer may have a single-layer structure or a multilayer structure, and may include at least one of, for example, silicon oxide, silicon oxynitride, silicon nitride, a polymer, etc.

The semiconductor chip 200 vertically stacked on the semiconductor structure 100 may include a semiconductor layer 210, a circuit layer 220, and a front cover layer 250. In FIGS. 1, 2 and 3, only a single semiconductor chip 200 is shown, but any reasonable number of semiconductor chips 200 may be included in the semiconductor package 1000. For example, one or more semiconductor chips may be vertically stacked on the semiconductor structure 100 and/or laterally disposed in a horizontal direction with respect to the semiconductor structure 100. The semiconductor layer 210 and the circuit layer 220 of the semiconductor chip 200 may be substantially the same as the semiconductor layer 110 and the circuit layer 120 of the semiconductor structure 100.

Here, it should be noted that during the manufacture of the semiconductor package 1000, the bonding pads 132 and 252 and/or the bonding insulating layers 131 and 251 may suffer from a so-called "dishing phenomenon," wherein one or more surface(s) becomes locally over-recessed, thereby forming a dish shaped surface. This result may degrade the performance and/or reliability of the semiconductor package 1000.

Accordingly, direct or hybrid bonding techniques used in relation to the bonding pads 132 and 252 and the bonding insulating layers 131 and 251 should be carefully and stably provided within methods of manufacturing semiconductor packages according to embodiments of the inventive concept, so that such the foregoing result is prevented.

Hereinafter, when a bonding structure is described in relation to FIG. 3, the back insulating layer 131 of the back cover layer 130 of the semiconductor structure 100 may be referred to as a "first bonding insulating layer 131," the back pad 132 may be referred to as a "first bonding pad 132." Similarly, the front insulating layer 251 of the front cover layer 150 of the semiconductor chip 200 may be referred to as a "second bonding insulating layer 251," and the front pad 252 may be referred to as a "second bonding pad 252."

In this regard, the first bonding insulating layer 131 may include an opening ("OP" of FIG. 9B) exposing an upper surface of the through-via 140. The first bonding insulating layer 131 may include a first insulating layer 131a, a second insulating layer 131b, and a third insulating layer 131c sequentially stacked on the semiconductor layer 110. The first insulating layer 131a may extend along the back surface 110BS of the semiconductor layer 110, and may include a portion extending between a side surface of the second insulating layer 131b and a side surface of the through-via 140 around the through-via 140. The second insulating layer 131b may include a material different from that of the first insulating layer 131a and the third insulating layer 131c. For example, the second insulating layer 131b may include silicon nitride, while the first and third insulating layers 131a and 131c may include silicon oxide. However, those skilled in the art will recognize alternate configurations and materials for the first, second, and third insulating layers 131a, 131b, and 131c (e.g., various combinations of silicon oxide, silicon nitride, silicon oxynitride, silicon carbide, silicon oxycarbide, silicon carbonitride, etc.). In this regard, the second insulating layer 131b may substantially surround the respective through-vias 140 and yet be separated (or spaced apart) from the respective through-vias 140.

The first bonding pad 132 may be disposed in the opening of the first bonding insulating layer 131 to directly connect a through-via 140. Alternately, the first bonding pad 132 may be disposed in the opening of the first bonding insulating layer 131 to indirectly connect a through-via 140 (e.g., using an intervening interconnection structure).

In some embodiments, the first bonding pad 132 may be formed using a damascene method.

The first bonding pad 132 may include a first barrier layer 132a and a first metal material layer 132b, wherein the first barrier layer 132a substantially surrounds side surfaces and a lower surface of the first metal material layer 132b. The first barrier layer 132a may include a first recessed portion RS1 that is recessed downwardly from an upper surface of the first metallic material layer 132b (e.g., a surface formed by performing a wet etching process—see, e.g., FIG. 9H hereafter). A depth "d" of the recessed portion RS1 may be greater than or equal to a thickness "t" of the first barrier layer 132a. In some embodiments, the depth "d" may be about 300 nm or less, and the thickness "t" may range from about 100 nm to about 200 nm. The first metal material layer 132b may include at least one of, for example, Al, Au, Co, Cu, Ni, Pb, Ta, Te, Ti and W.

The second bonding insulating layer 251 may include an opening exposing a lower surface of a downwardly descending via 223. The via 223 may include a barrier layer 223a and a conductive layer 223b. The via 223 may be connected to an internal interconnection 222 of the circuit layer 220 of the semiconductor chip 200, for example. The second bonding insulating layer 251 may include at least one of, for example, silicon oxide, silicon nitride, silicon oxynitride, silicon carbide, silicon oxycarbide, and silicon carbonitride. In some embodiments, the second bonding insulating layer 251 may include the same material(s) as the third insulating layer 131c of the first bonding insulating layer 131, and may be bonded to the third insulating layer 131c using a dielectric-to-dielectric bonding technique.

An interlayer insulating layer 221 of the circuit layer 220 may include a dielectric layer 221a and a barrier layer 221b between the dielectric layer 221a and the second bonding insulating layer 251. In this regard, the barrier layer 221b may serve as an etch-stop layer and may include, for example, silicon nitride or aluminum oxide.

The second bonding pad 252 may be directly connected to the via 223. Similar to the first bonding pad 132, the second bonding pad 252 may be formed by a damascene method. The second bonding pad 252 may include a second barrier layer 252a and a second metal material layer 252b. The second barrier layer 252a may substantially surround side surfaces and an upper surface of the second metal material layer 252b. Similar to the first barrier layer 131a, the second barrier layer 252a may include a second recessed portion RS2 recessed upwardly to be higher than (or above) a lower surface of the second metal material layer 252b. Thus, the second recessed portion RS2 may be recessed away from the first recessed portion RS1 of the first barrier layer 132a. Hence, at least some of the first recessed portion RS1 of the first barrier layer 132a and at least some of the second recessed portion RS2 of the second barrier layer 252a may be separated (or spaced apart by a gap G) with respect to the bonding surfaces of the bonding pads 132 and 232. That is, the gap G may be an empty space (or void) surrounded by the bonding insulating layers 131 and 251, the barrier layers 132a and 252a, and the metal material layers 132b and 252b.

Figure 4:
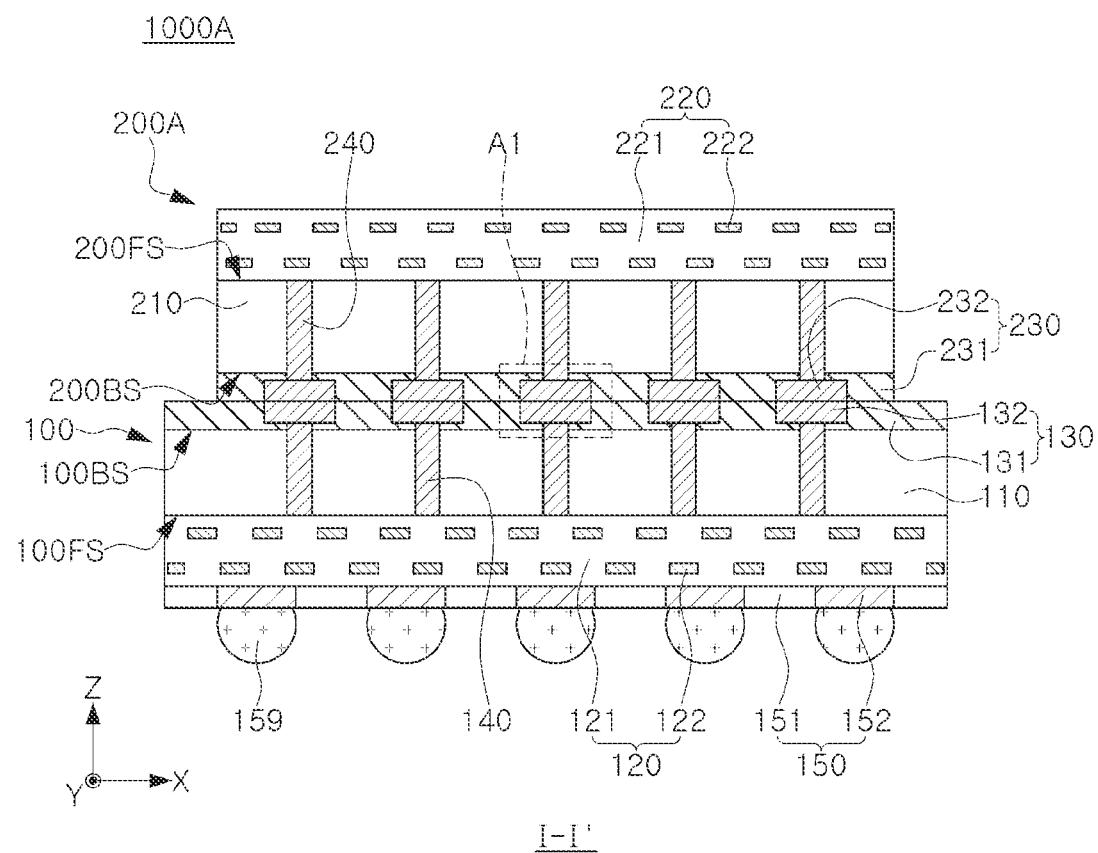
FIG. 4 is a cross-sectional view illustrating a semiconductor package according to embodiments of the inventive concept.
Figure 5:
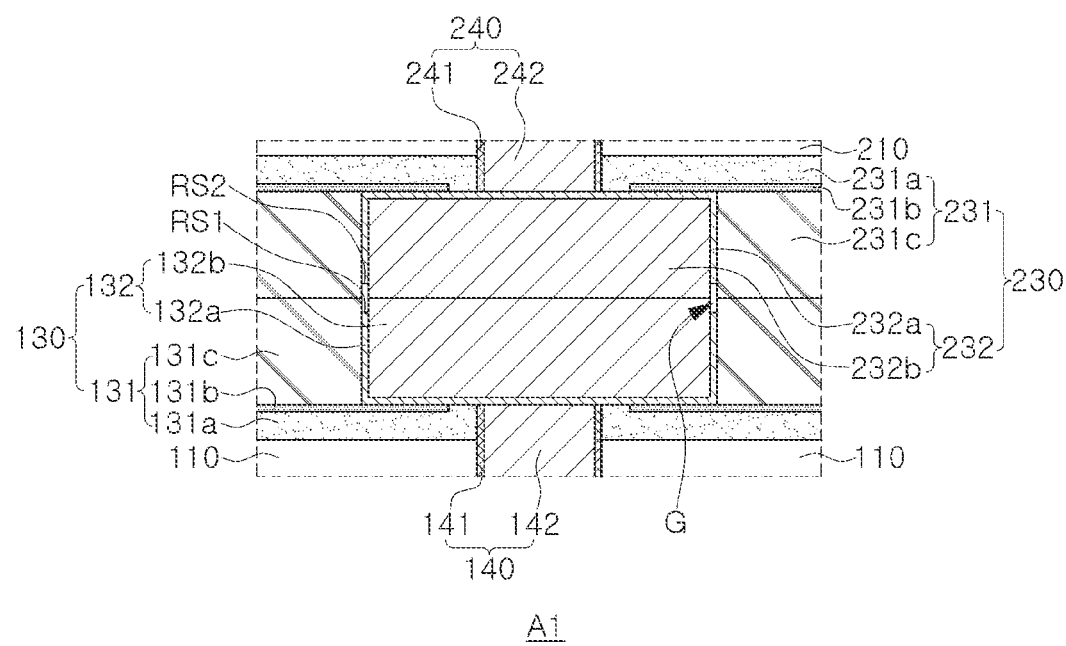
FIG. 5 is an enlarged view of region 'A1' indicated in in FIG. 4.

In contrast to the comparative example described in relation to FIGS. 2 and 3, FIG. 4 is a cross-sectional view of a semiconductor package 1000A according to embodiments of the inventive concept, and FIG. 5 is an enlarged view of region 'A1' indicated in in FIG. 4.

Referring to FIGS. 4 and 5, the semiconductor package 1000A may include a back cover layer 230 disposed on a back surface 200BS of a semiconductor layer 210 of a semiconductor chip 200A, and through-vias 240 that penetrate through the semiconductor layer 210 to connect a back pad 232, a second bonding pad of the cover layer 230. A back insulating layer 231, a second bonding insulating layer, may include a first insulating layer 231a, a second insulating layer 231b, and a third insulating layer 231c. The first, second, and third insulating layers 231a, 231b, and 231c of the second bonding insulating layer 231 have a structure, similar to that of the first to third insulating layers 131a, 131b, and 131c of the first bonding insulating layer 131 and have a vertically inverted shape. The second bonding pad 232 may include a second barrier layer 232a and a second metallic material layer 232b, and a recessed portion RS2 may be formed in the second barrier layer 232a. Here, however, recognizing that the dishing phenomena may occur in relation to the bonding pads 132 and 232 and the bonding insulating layers 131 and 231, steps are taken to prevent same, and accordingly, direct or hybrid bonding of the bonding pads 132 and 232 and the bonding insulating layers 131 and 231 may be stably provided.

Figure 6A:
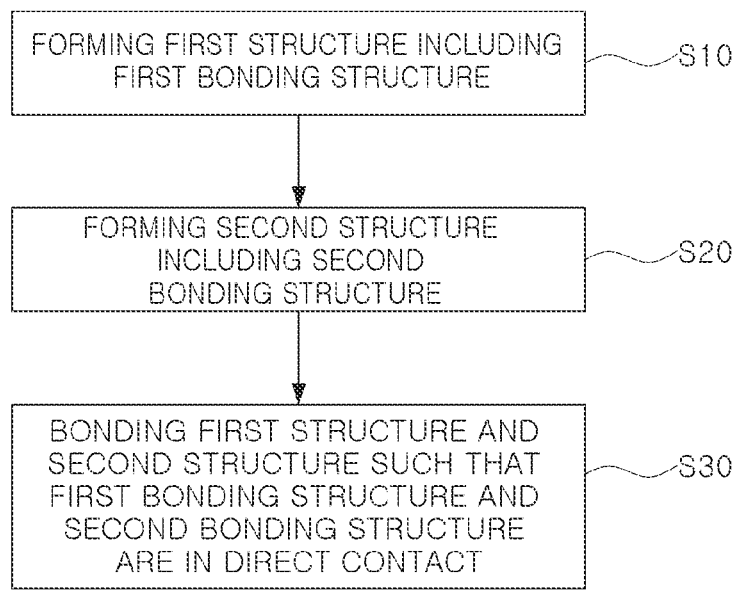
FIG. 6A is a flowchart illustrating a method of manufacturing a semiconductor package according to embodiments of the inventive concept.
Figure 6B:
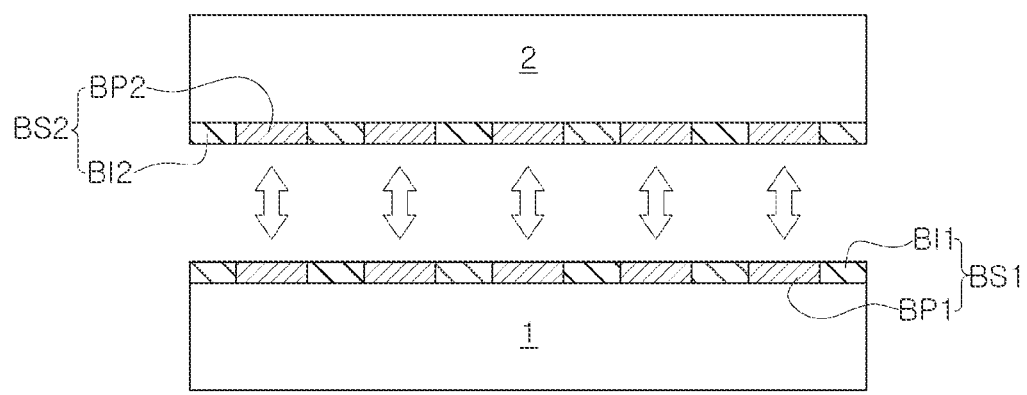
FIG. 6B is a conceptual diagram further illustrating the bonding of structures within the method of FIG. 6A.

FIG. 6A is a flowchart illustrating a method of manufacturing a semiconductor package according to embodiments of the inventive concept, and FIG. 6B is a conceptual diagram illustrating the bonding a first structure 1 and a second structure 2 using the method of manufacturing a semiconductor package summarized in FIG. 6A.

Referring to FIGS. 6A to 6B, the first structure 1 including a first bonding structure BS1 may be prepared (S10). The second structure 2 including a second bonding structure BS2 may also be prepared (S20). Then, the first structure 1 and the second structure 2 may be bonded such that the first bonding structure BS1 and the second bonding structure BS2 are in direct contact with each other (S30).

For example, the first bonding structure BS1 may include a first bonding pad BP1 and a first bonding insulating layer BI1 surrounding at least a portion of a side surface of the first bonding pad BP1, and a second bonding structure BS2 may include a second bonding pad BP2 and the second bonding insulating layer BI2 surrounding at least a portion of a side surface of the second bonding pad BP2. In some embodiments, the first bonding pad BP1 and the second bonding pad BP2 may be directly bonded using a copper-to-copper (Cu-to-Cu) bonding technique. Further in some embodiments, the first bonding insulating layer BI1 and the second bonding insulating layer BI2 may be directly using a dielectric-to-dielectric bonding technique.

Thus, in some embodiments, the bonding of the first structure 1 and the second structure 2 may be a die-to-die bonding or a wafer-to-wafer bonding. For example, assuming that the first structure 1 and the second structure 2 are respective semiconductor chips, the bonding of the first structure 1 and the second structure 2 may be a die-to-die bonding. Hence, when the first structure 1 is a semiconductor structure among semiconductor structures divided by scribe lanes on a semiconductor wafer, and the second structure 2 is a semiconductor chip respectively disposed on each of semiconductor structures, the bonding of the first structure 1 and the second structure 2 may be die-to-wafer bonding. Further, assuming that the first structure 1 and the second structure are respective semiconductor structures among semiconductor structures divided by scribe lanes, the bonding of the first structure 1 and the second structure 2 may be wafer-to-wafer bonding.

Figure 7:
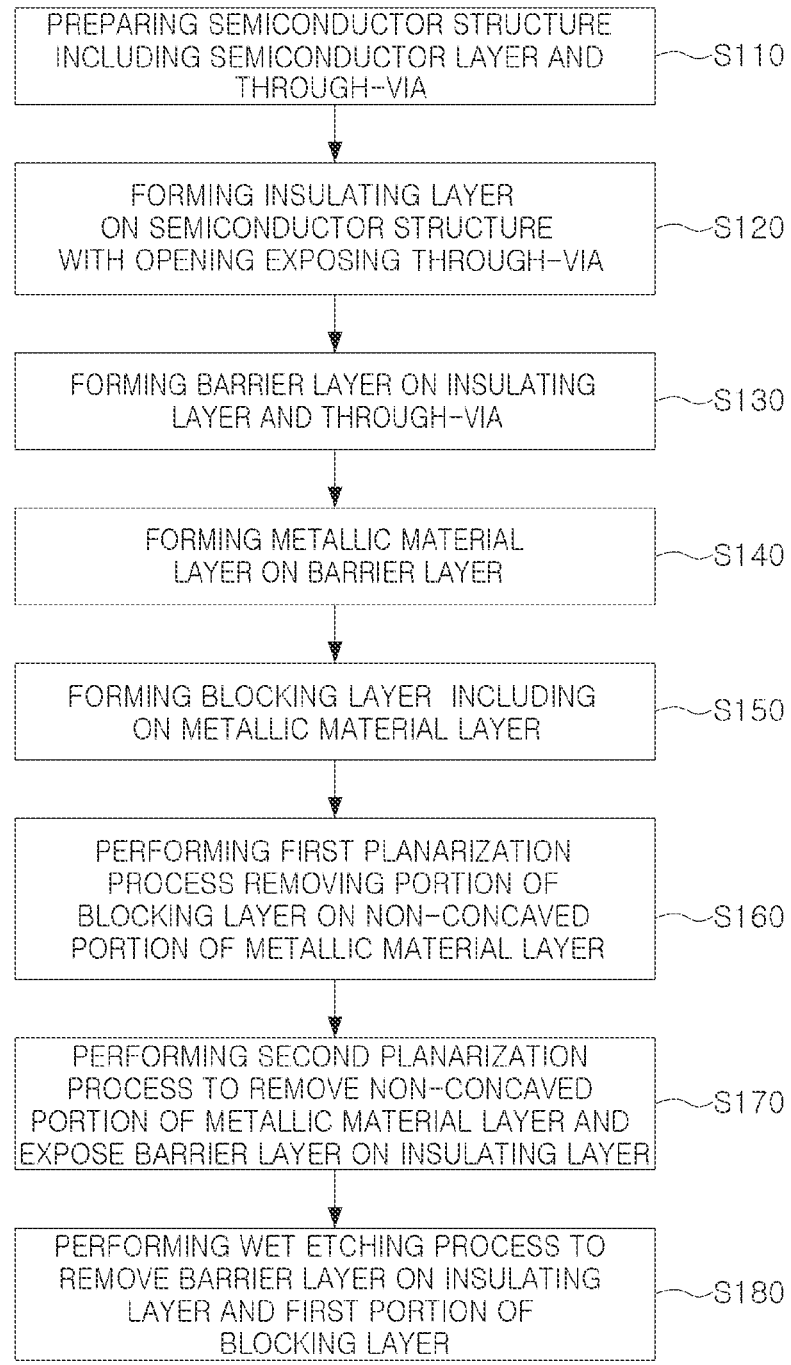
FIG. 7 is a flowchart illustrating a method of manufacturing a semiconductor package according to embodiments of the inventive concept.
Figure 10:
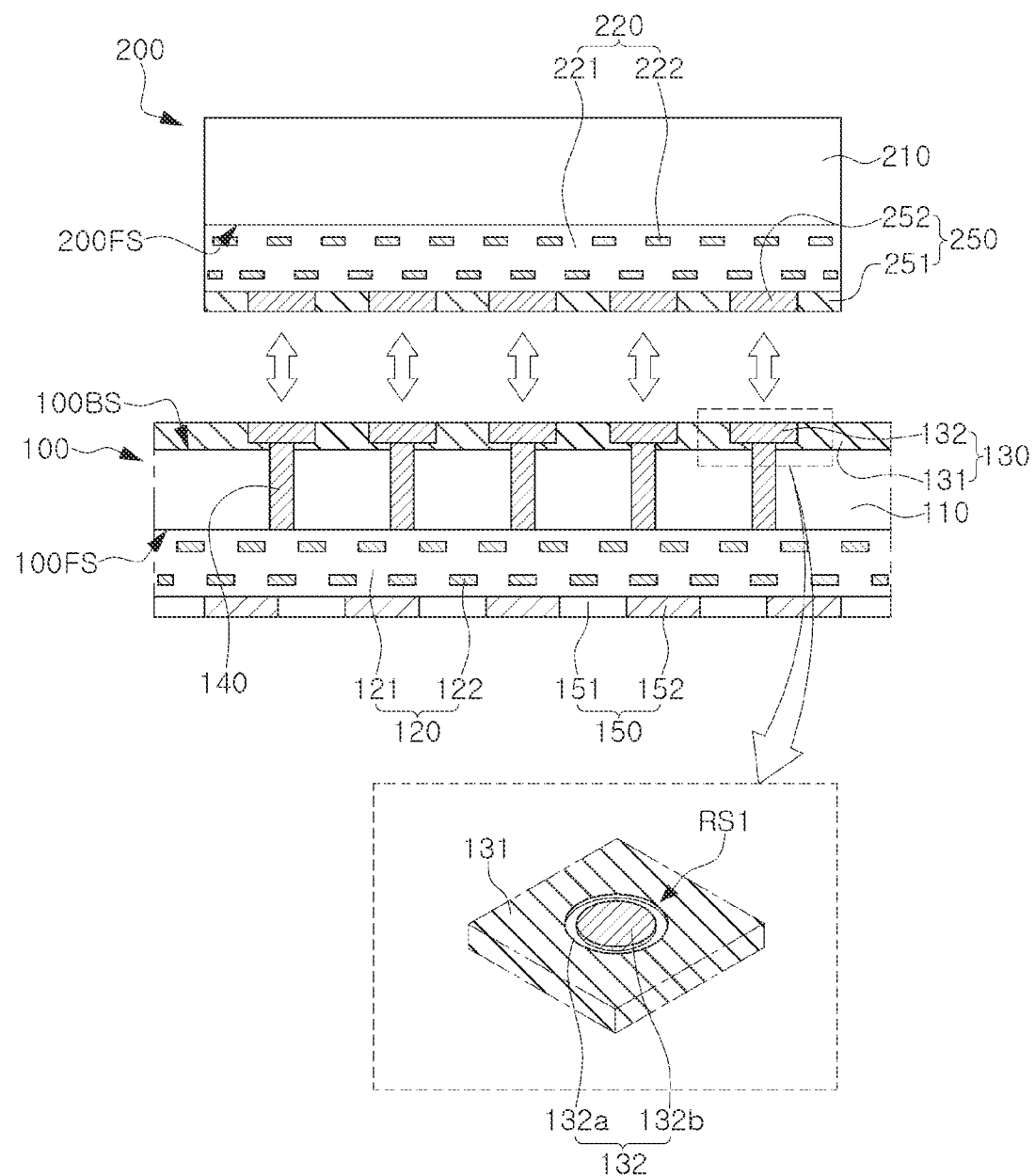
FIGS. 10 and 11 are additional diagram sets further illustrating bonding step(s) for bonding structures during the methods of FIGS. 8A to 8D and FIGS. 9A to 9H.
Figure 11:
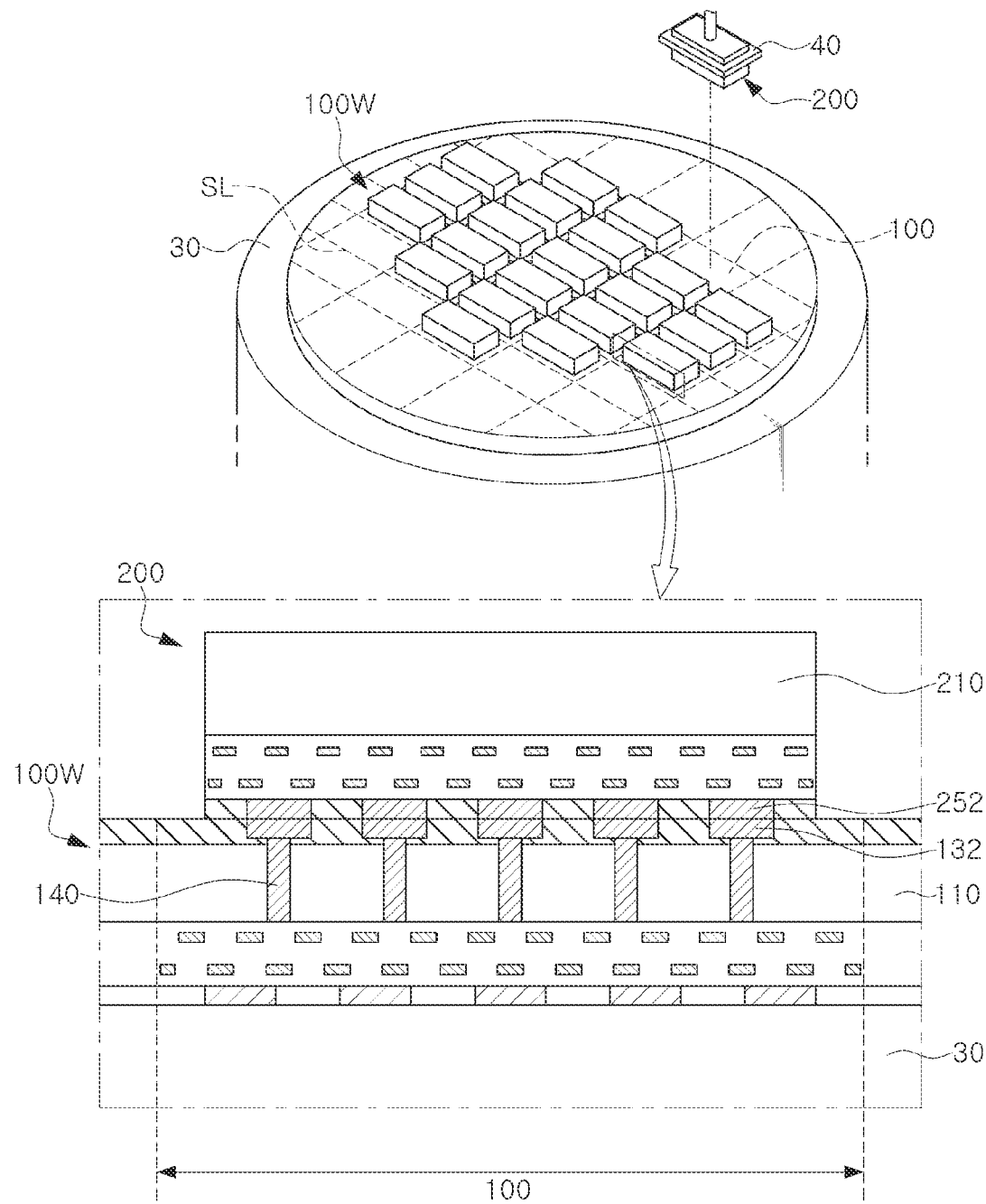

FIG. 7 is a flowchart illustrating a method of manufacturing a semiconductor package according to embodiments of the inventive concept; FIGS. 8A to 8D are related cross-sectional views illustrating in one example a method of manufacturing for a semiconductor package according to embodiments of the inventive concept; FIGS. 9A to 9H are related cross-sectional views illustrating in another example a method of manufacturing a semiconductor package according to embodiments of the inventive concept, and more particularly illustrating the formation of bonding pad; and FIGS. 10 and 11 are respective drawings sets further illustrating various bonding structures resulting from the methods of manufacture described in relation to FIGS. 8A to 8D and FIGS. 9A to 9H.

That is, FIG. 7, FIGS. 8A to 8D and FIGS. 9A to 9H collectively illustrate method(s) of manufacture, wherein the first structure 1 and the second structure 2 of FIG. 6B may be properly bonded (i.e., without the dishing phenomenon) to form the semiconductor structure 100 of FIG. 2.

Figure 8A:
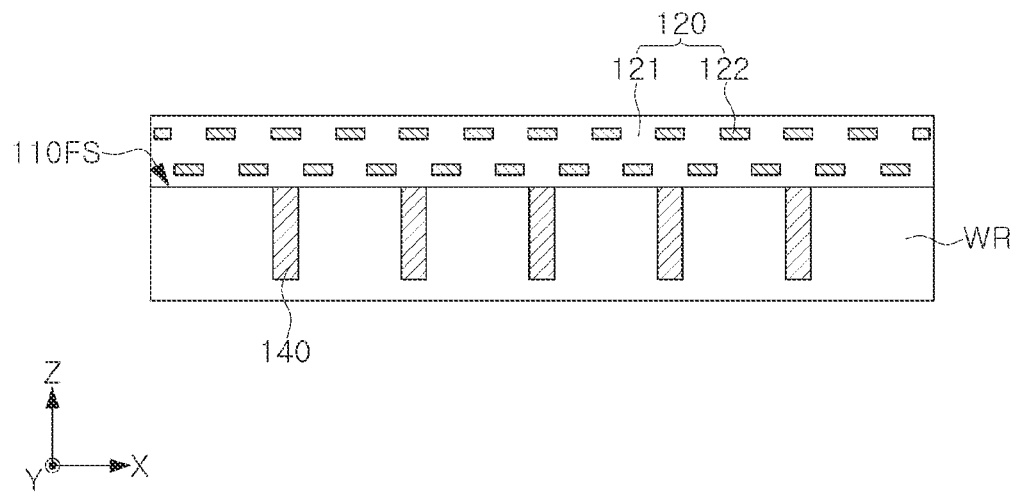
FIGS. 8A, 8B, 8C and 8D (hereafter collectively, "FIGS. 8A to 8D") are related cross-sectional views illustrating certain manufacturing steps associated with methods of manufacturing semiconductor packages according to embodiments of the inventive concept.

Referring to FIG. 8A, a through-via 140 and a circuit layer 120 may be formed on a semiconductor wafer WR. The through-via 140 may penetrate the semiconductor wafer WR from a front surface 110FS of the semiconductor wafer WR. In some embodiments, the through-via 140 may include a conductive barrier layer, a via insulating layer, and a through-electrode surrounding a side surface having a columnar shape. The via insulating layer may be formed of at least one of, for example silicon oxide, silicon nitride, silicon oxycarbide, and a polymer. The circuit layer 120 may include the interlayer insulating layer 121 and the internal interconnections 122, and may further include discrete components (not shown) disposed on the front surface 110FS of the semiconductor wafer WR.

In some embodiments, the through-vias 140 may respective via-first structures, however the through-vias 140 might alternately be via-middle structures or via-last structures. In this context, the term "via-first structure" refers to a structure in which the through-vias 140 are formed before the discrete components associated with the circuit layer 120 are formed, the term "via-middle structure" refers to a structure in which the through-vias 140 are formed before the internal interconnections 122 are formed but after the discrete components are formed, and the term "via-last structure" refers to a structure in which the through-vias 140 are formed after the internal interconnections 122 are formed.

Figure 8B:
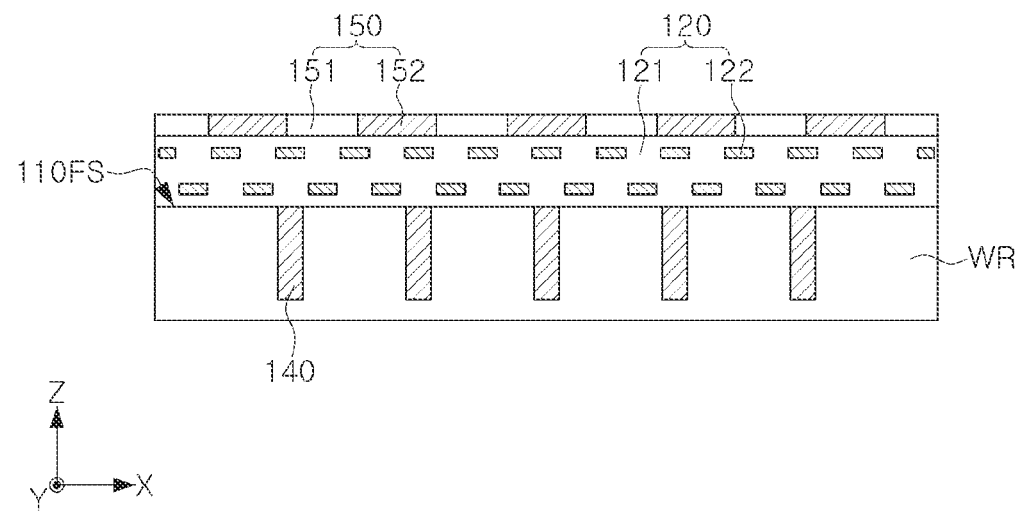

Referring to FIG. 8B, a front cover layer 150 may be formed on the front surface 110FS of the semiconductor wafer WR. The front cover layer 150 may be formed on the circuit layer 120, and may include a front insulating layer 151 and a front pad 152. The front pad 152 may be connected to the internal interconnections 122 through an additional via formed on an uppermost one of the internal interconnections 122.

Figure 8C:
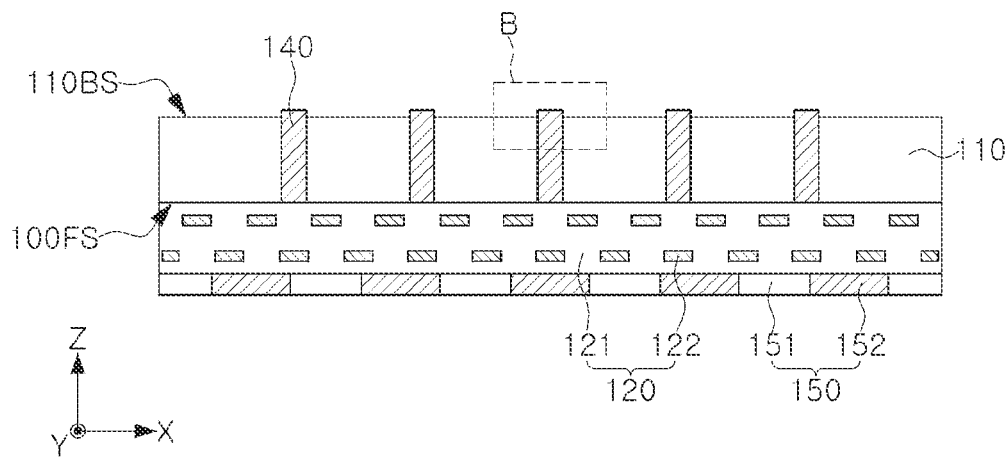

Referring to FIG. 8C, a portion of the semiconductor wafer WR may be removed to expose at least a portion (e.g., an upper surface) of the through-via 140.

Thus, referring to FIGS. 7, 8A, 8B and 8C, a semiconductor structure may be prepared that includes the semiconductor layer 110 and the through-vias 140 (S110). In some embodiments, a via similar to the via 223 of FIG. 3 may be exposed through an interlayer insulating layer 121 or 221 in contrast to the through-vias 140 penetrating the semiconductor layer 110. Here, the semiconductor layer 110 may be a material layer formed by removing a portion of the semiconductor wafer WR, and multiple semiconductor layers 110 may be formed on the semiconductor wafer WR.

Figure 8D:
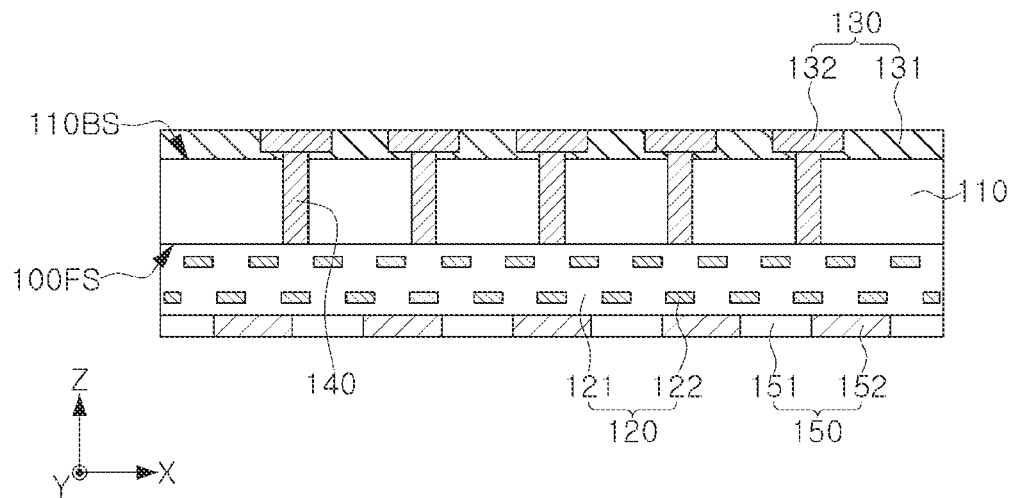

Referring to FIG. 8D, the back cover layer 130 may be formed on the back surface 110BS of the semiconductor layer 110. The back cover layer 130 may include the back insulating layer 131 and back pads 132. Here, each of the back pads 132 may be a bonding pad exposed through the back insulating layer 131, wherein each of the back pads 132 may be respectively and directly connected to one of the through-vias 140.

FIGS. 9A to 9H are related cross-sectional views illustrating in greater detail the formation of the back cover layer 130 in a state in which each of the through-vias 140 is exposed as shown in FIG. 8C. Here, FIGS. 9A to 9H further illustrate a region 'B' indicated in FIG. 8C.

Figure 9A:
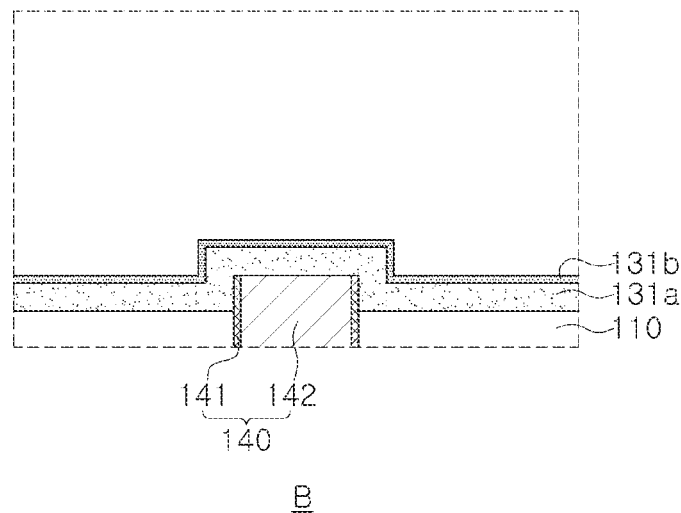
FIGS. 9A, 9B, 9C, 9D, 9E, 9F, 9G and 9H (hereafter collectively, "FIGS. 9A to 9H") related cross-sectional views illustrating certain steps associated with methods of manufacturing semiconductor packages according to embodiment of the inventive concept, and more particularly the formation of bonding pad(s) within the semiconductor packages.
Figure 9B:
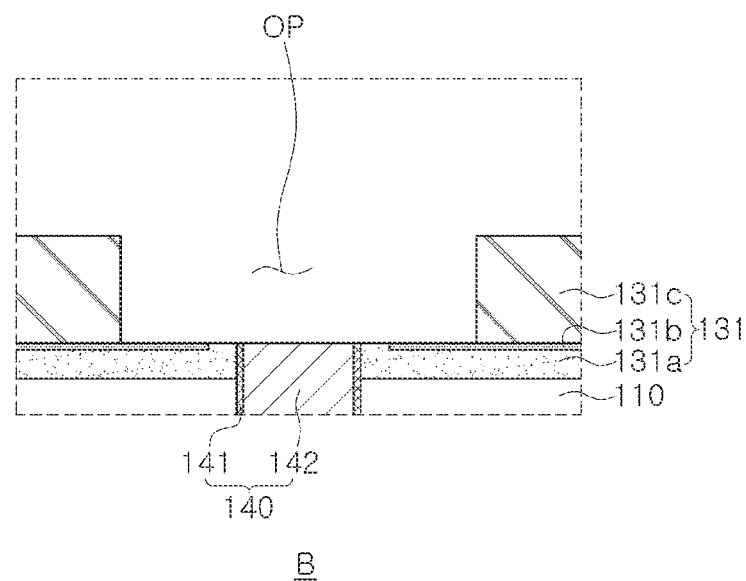

Referring to FIGS. 7, 9A, and 9B, the insulating layer 131 including an opening OP exposing at least a respective portion of each of the through-vias 140 may be formed on the semiconductor structure 100 (S120).

Referring to FIG. 9A, a first insulating layer 131*a* may be formed an upper surface and side surfaces of each one of the through-vias 140, as exposed through the semiconductor substrate 110. That is, the first insulating layer 131*a* may extend across the back surface 110BS of the semiconductor layer 110.

A second insulating layer 131*b*, including a material different from that of the first insulating layer 131*a*, may be formed on the first insulating layer 131*a*. For example, the first insulating layer 131*a* may be formed of silicon oxide and the second insulating layer 131*b* may be formed of silicon nitride. Since each one of the through-vias 140 extends upward from the back surface 110BS of the semiconductor layer 110, each of the first insulating layer 131*a* and the second insulating layer 131*b* may be formed (or molded) around the side surfaces and the upper surface of the respective through-vias 140.

Referring to FIG. 9B, a planarization process may be performed to remove portions of the first insulating layer 131*a* and the second insulating layer 131*b* extending above the through-via 140. A third insulating layer 131*c* may then be formed on the second insulating layer 131*b*, and patterned to form an opening OP exposing the upper surface of the through-via 140. That is, by applying the planarization process, a portion of the first insulating layer 131*a* and a portion of the second insulating layer 131*b* may be removed to expose a surface of a portion in which the first insulating layer 131*a* extends between the second insulating layer 131*b* and the through-via 140. Then, the third insulating layer 131*c* may be formed, and an opening OP may be formed that penetrates through the third insulating layer 131*c*. In this case, an upper surface of the first insulating layer 131*a*, an upper surface of the second insulating layer 131*b*, and an upper surface of the through-via 140 may be exposed through the opening OP. Accordingly, an insulating layer 131 including a combination of the first insulating layer 131a, the second insulating layer 131b, the third insulating layer 131c, and the opening OP may be formed.

Figure 9C:
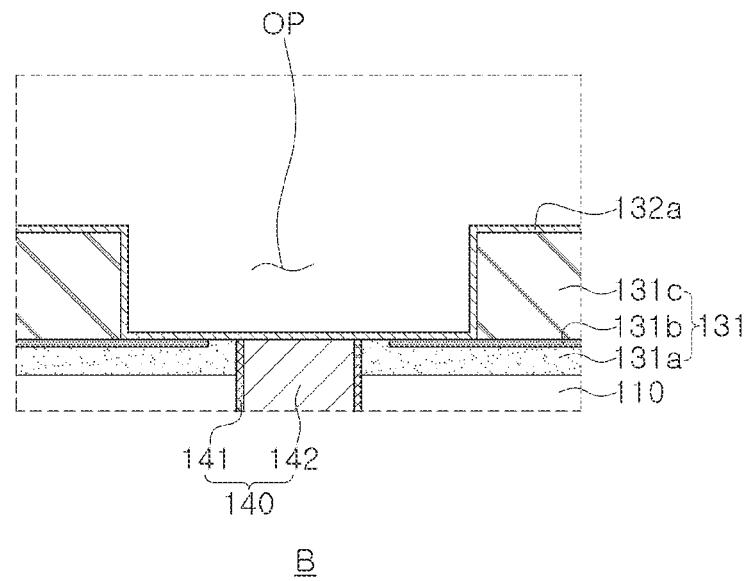

Referring to FIGS. 7 and 9C, a barrier layer 132a may be formed on the resulting insulating layer 131 and the through-via 140 (S130). Here, the barrier layer 132a may substantially and conformally cover the side surfaces and bottom surface of the opening OP. Thus, the barrier layer 132a may cover portions of the insulating layer 131 exposed through the opening OP, and may extend horizontally along the upper surface of the insulating layer 131. In this regard, the barrier layer 132a may be used as a seed layer and a diffusion barrier layer during a subsequently applied plating process that is used to form a metallic material layer 132b. Here, the barrier layer 132a may include at least one of, for example, Ti, TiN, Ta, TaN, and Cu.

Figure 9D:
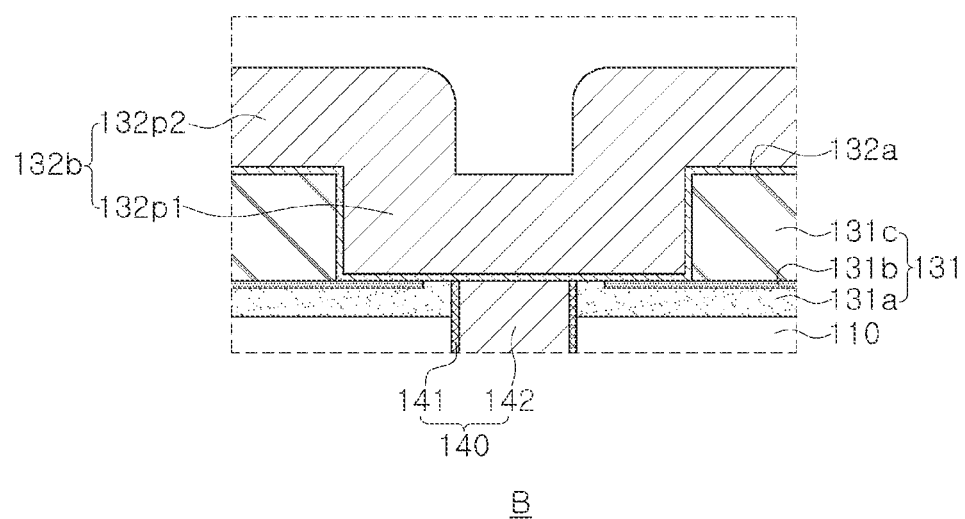

Referring to FIGS. 7 and 9D, the metallic material layer 132b may be formed on the barrier layer 132a (S140). In this regard, the metallic material layer 132b may substantially fill the opening OP to a thickness about the same as a thickness of the third insulating layer 131c. When the metallic material layer 132b and the third insulating layer 131c have substantially the same thickness, a flat bonding surface may be provided in relation to subsequently applied process(es). However, embodiments of the inventive concept are not limited thereto, and the thickness of the metallic material layer 132b may be different from the thickness of the third insulating layer 131c.

Of further note, the metallic material layer 132b may be understood as including a first portion 132p1 formed substantially within the opening OP, as well as a second portion 132p2 having a higher level than that of the first portion 132p1 on the insulating layer 131. (In this regard, the term "level" refers to distance (e.g., measured in the vertical direction) in relation to an arbitrarily selected horizontal plane (e.g., the upper surface of the insulating layer 131). Accordingly, the first portion 132p1 may be a concave portion of the metallic material layer 132, while the second portion 132p2 may be a non-concaved (e.g., a convex or substantially flat) portion of the metallic material layer 132. Here, the non-concaved portion 132p2 may have a shape protruding vertically upward from the concave portion 132p1, and the metallic material layer 132b may have an overall shape that is uneven but including the integral combination of the first part 132p1 and the second part 132p2. Thus, in some embodiments, a region of the metallic layer 132b in which the first part 132p1 and the second part 132p2 are joined may be characterized by an outwardly convex surface.

Figure 9E:
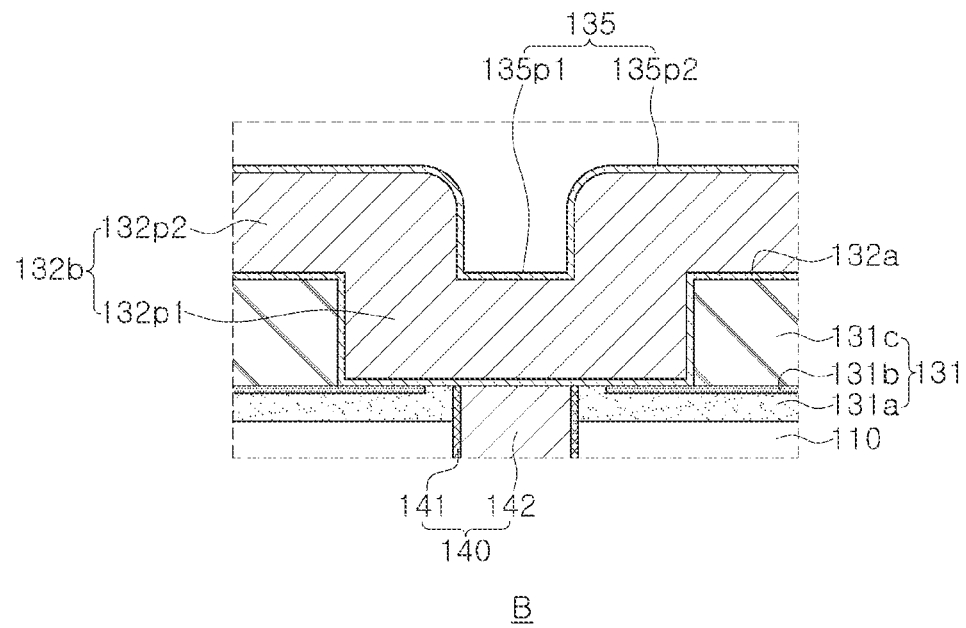

Referring to FIGS. 7 and 9E, a blocking layer 135 including the same material as the barrier layer 132a may be formed on the metallic material layer 132b (S150). Alternately, the blocking layer 135 may include a material different from the material of the barrier layer 132a, so long as the material of the blocking layer 135 has an etching selectivity with respect to the metallic material layer 132b and the insulating layer 131 under conditions appropriate to a subsequently applied wet etching process.

In this regard, the blocking layer 135 may substantially and conformally cover the concave portion 132p1 and the non-concave portion 132p2 of the metallic material layer 132b. Hence, the blocking layer 135 may be understood as including a first portion 135p1 on the concave portion 132p1 of the metallic material layer 132b and a second portion 135p2 on the non-concaved portion 132p2 of the metallic material layer 132b. Although a portion of the second portion 135p2 of the blocking layer 135 may cover a convex side portion of the non-caved portion 132p2. Of note in this regard, the blocking layer 135 may be formed to prevent the dishing phenomenon previously described in which a portion of the surface of the metallic material layer 132b becomes locally over-recessed during a subsequently performed planarization process.

Figure 9F:
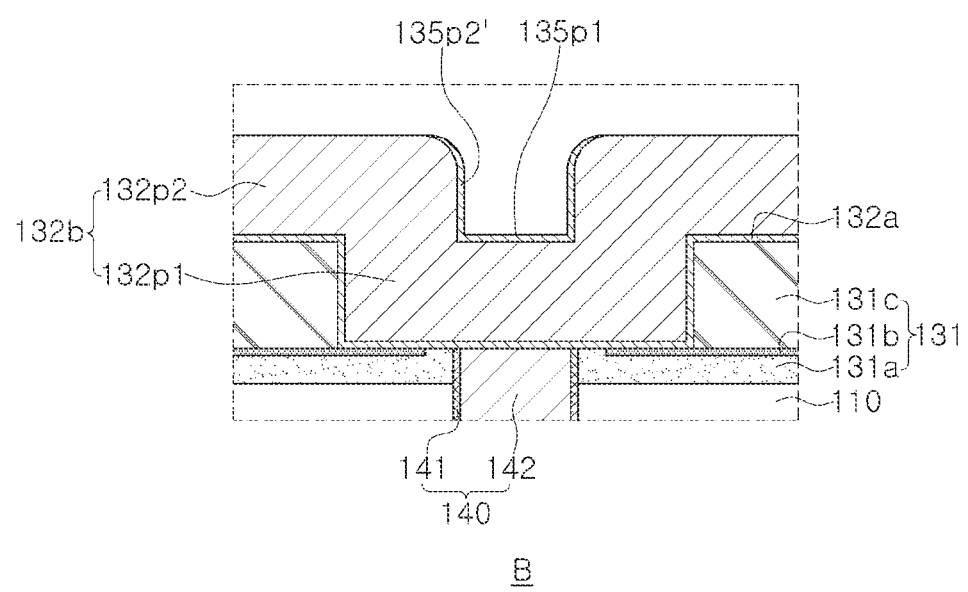

Referring to FIGS. 7 and 9F, a first planarization process may be performed such that the first portion 135p1 of the blocking layer 135 on the concave portion 132p1 of the metal material layer 132b remains, whereas the second portion 135p2 of the blocking layer 135 on the non-concaved portion 132p2 of the metal material layer 132b is removed (S160). That is, the first planarization process may be performed to remove a portion of the blocking layer 135 on uppermost surfaces of the metallic material layer 132b. After performing the first planarization process, a surface of the non-concaved portion 132p2 of the metallic material layer 132b on the insulating layer 131 may be exposed. However, a residual portion 135p2' of the second portion 135p2 of the blocking layer 135 may remain on a convex side surface of the non-concaved portion 132p2. In some embodiments, in order to remove a portion of the blocking layer 135 on the uppermost surface of the metallic material layer 132b, a first processing time associated with the performing of the first planarization process may be relatively shorter than a second processing time associated with a second planarization process described hereafter. Of further note in this regard, a polishing pad used during the first planarization process may not be able to reach the first portion 135p1 of the blocking layer 135.

Figure 9G:
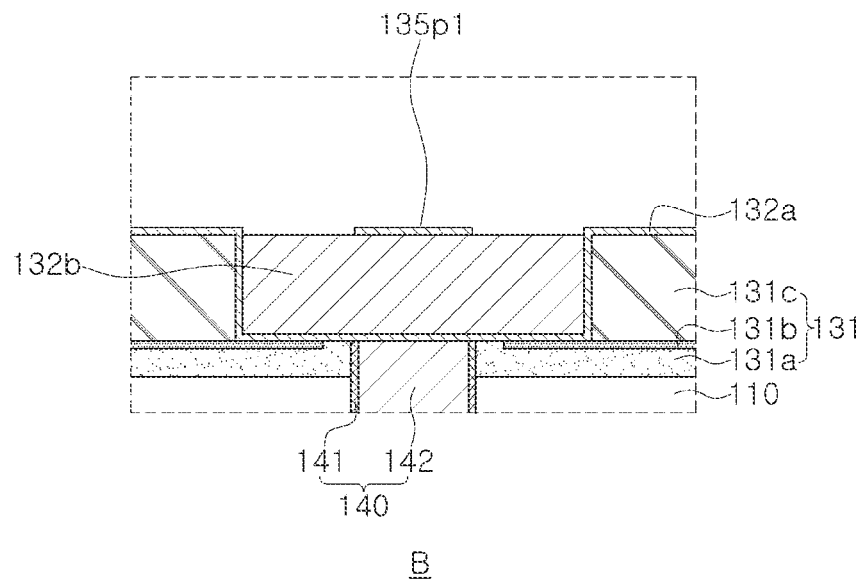

Referring to FIGS. 7 and 9G, the second planarization process may be performed to remove the non-concaved portion 132p2 of the metallic material layer 132b and expose the barrier layer 132a on the insulating layer 131 (S170). After the second planarization process, a portion of the surface of the metallic material layer 132b below the first portion 135p1 of the blocking layer 135 may not be exposed. However, since the first portion 135p1 of the blocking layer 135 covers a central surface of the concave portion 132p1 of the metallic material layer 132b, a surface of the metallic material layer 132b close to an edge of the opening OP may be exposed by a second planarization process. During the second planarization, a central region of the surface of the metallic material layer 132b (i.e., a portion relatively more susceptible to the dishing phenomenon) may be protected by the first portion 135p1 of the blocking layer 135.

Figure 9H:
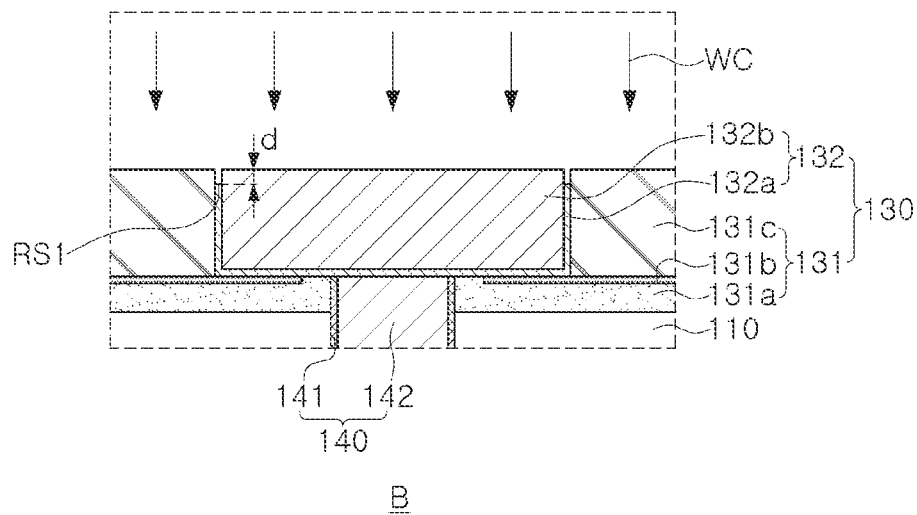

Referring to FIGS. 7 and 9H, a wet etching process may now be performed to remove the barrier layer 132a on the insulating layer 131 and the first portion 135p1 of the blocking layer 135. Of note, the first recessed portion RS1—that is, a recess below the upper surface of the metallic material layer 132b—may be formed on the barrier layer 132a as the result of the wet etching process.

That is, in some embodiments, an etchant WC used during the wet etching process may include an alkali-based compound, an aqueous hydrogen fluoride-based compound, and/or hydrogen peroxide. Since the barrier layer 132a and the blocking layer 135 are formed of a material having an etching selectivity with respect to the metallic material layer 132b and the insulating layer 131, the etchant WC may selectively remove only a portion of the barrier layer 132a and the blocking layer 135. After the wet etching process, at least a portion of the side surface of the insulating layer 131 and the side surface of the metallic material layer 132b, facing each other, may be exposed.

FIGS. 10 and 11 are respective drawing sets illustrating examples of die-to-wafer bonding. Referring collectively to FIGS. 10 and 11, a semiconductor chip 200 may be pre-bonded to a wafer structure 100W in which semiconductor structures 1000 are formed on an electrostatic chuck 30 using a pick-and-place device 40. The wafer structure 100W may include semiconductor structures 100 divided by scribe lanes SL. The semiconductor chip 200 may include a bonding pad 252, and may be directly disposed on the semiconductor structures 100. Here, the term "pre-bonding" may be understood as placing the semiconductor chip 200 on a corresponding semiconductor structure 100 without applying pressure or heat. Then, dielectric-to-dielectric bonding and copper-to-copper bonding may be performed to bond the semiconductor chip 200 and the semiconductor structure 100. As illustrated in FIG. 10, the bonding pad 132 may include the metallic material layer 132b disposed in an opening OP of the insulating layer 131. Further, the barrier layer 132a may be disposed on inner side surfaces of the opening OP. The metallic material layer 132b and the first recessed portion RS1 may be formed in the barrier layer 132a.

Figure 12:
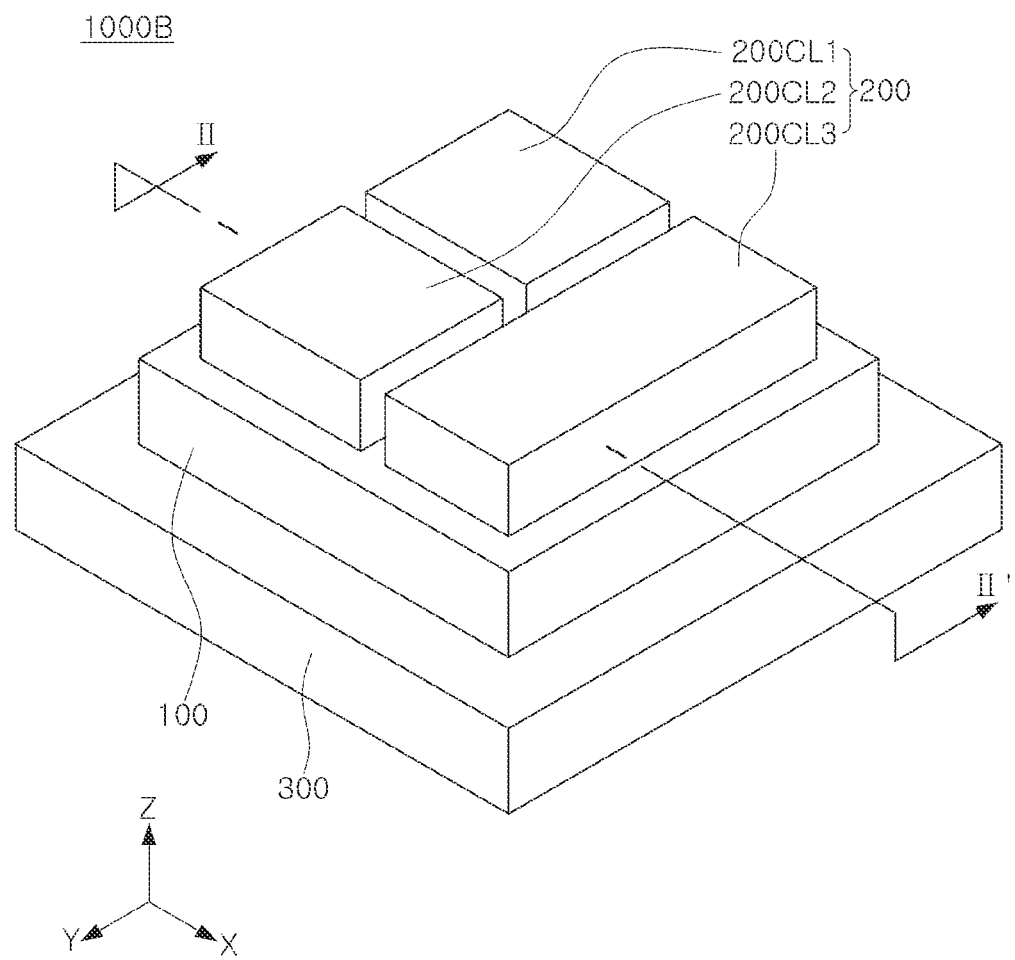
FIG. 12 is a perspective view illustrating semiconductor packages according to embodiments of the inventive concept.
Figure 13:
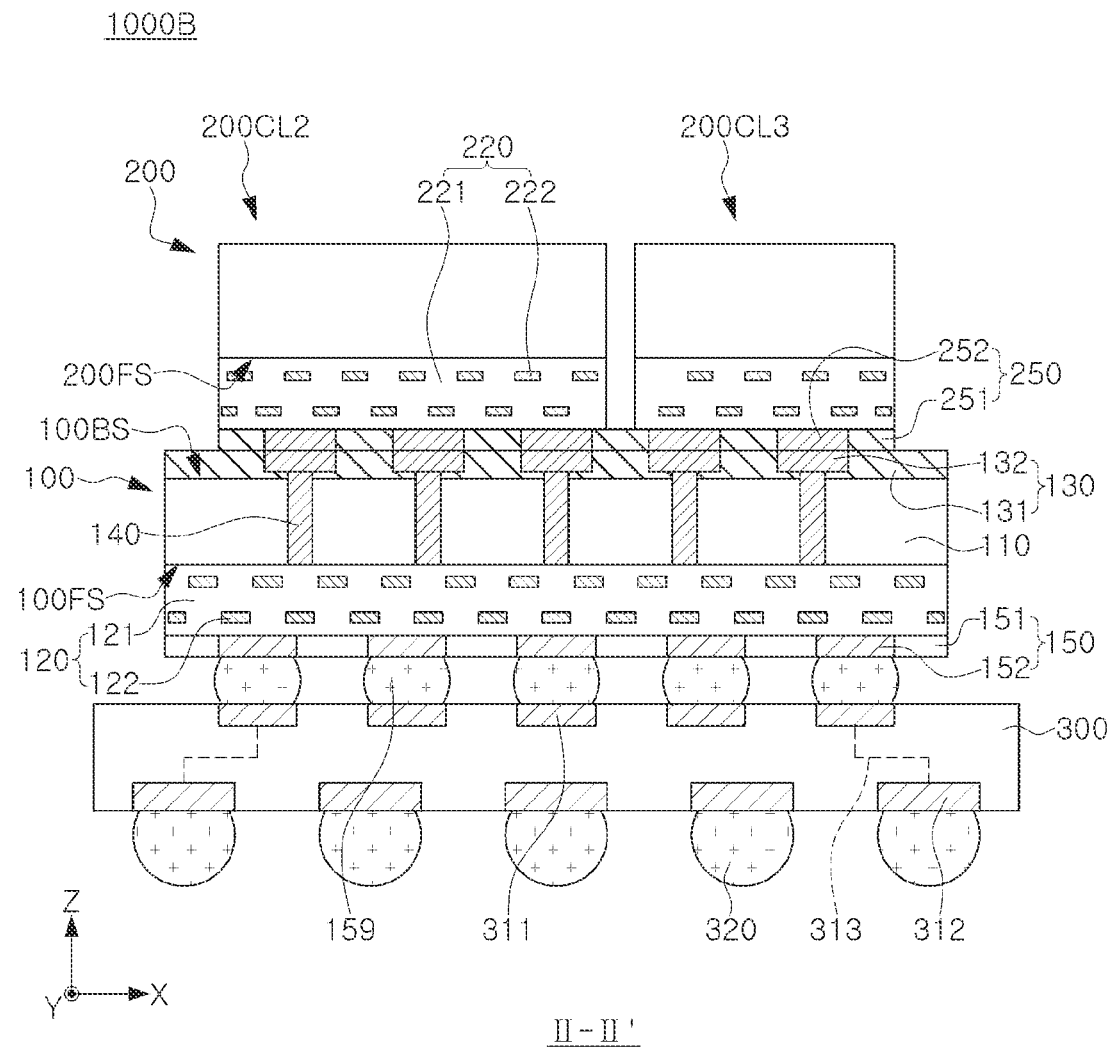
FIGS. 13, 14 and 15 are respective cross-sectional views illustrating various semiconductor packages according to embodiments of the inventive concept.

FIG. 12 is a perspective view illustrating a semiconductor package 1000B according to embodiments of the inventive concept, and FIG. 13 is a cross-sectional view of the semiconductor package 1000B taken along line II-If of FIG. 12.

Referring to FIGS. 12 and 13, the semiconductor package 1000B may be substantially similar to the semiconductor package 1000 of FIGS. 1, 2 and 3, except that a semiconductor chip 200 is provided as chiplets 200CL1, 200CL2, and 200CL3 arranged side by side on a semiconductor structure 100 and the dishing phenomenon in avoided. Thus, the semiconductor structure 100 and the semiconductor chip 200 may be mounted (e.g., mechanically assembled and/or electrically connected) on a package substrate 300.

The chiplets 200CL1, 200CL2, and 200CL3 may refer to respective chips constituting a multi-chip module (MCM). The MCM may include an input/output (I/O) device, a central processing unit (CPU), a graphics processing unit (GPU), a field programmable gate array (FPGA) chip, and the like. For example in FIG. 13, the first chiplet 200CL1 may be a GPU chip, the second chiplet 200CL2 may be a CPU chip, and the third chiplet 200CL3 may be an FPGA chip. Any reasonable number of chiplets may be stacked on the semiconductor structure 100. In some embodiments, two or four chiplets may be mounted on the semiconductor structure 100. In this regard, the term "chiplet" refers to a semiconductor chip manufactured according to respective size and/or function.

The semiconductor structure 100 may be, for example, an active interposer performing functions of an I/O chip. The semiconductor structure 100 may include an input/output (I/O) device, a direct current (DC)-to-DC converter, a sensor, a test circuit, etc. Therefore, the chiplets 200CL1, 200CL2, and 200CL3 and the semiconductor structure 100 may constitute the MCM.

In FIGS. 12 and 13, the semiconductor structure 100 is shown as being mounted on the package substrate 300 through the connection member 159. However, depending on the type of the base substrate 300 (e.g., a silicon substrate), the bonding layer 150 may form hybrid bonding with the package substrate 300. In this case, a bonding structure including bonding pads may have a structure, similar to that described above with reference to FIG. 3.

As an example, a package substrate 300 may include lower pads 312 disposed on a lower surface of a body, upper pads 311 disposed on an upper surface of the body, and a redistribution circuit 313 variously connecting the lower pads 312 and the upper pads 311. The package substrate 300 may be a substrate for a semiconductor package including a printed circuit board (PCB), a ceramic substrate, a glass substrate, a tape interconnection substrate, etc. The body of the package substrate 300 may include different materials depending on the type of the substrate. For example, when the package substrate 300 is a printed circuit board, it may be a form in which an interconnection layer is additionally laminated on one side or both sides of a body copper clad laminate or a copper clad laminate. A solder resist layer may be formed on each of the lower and upper surfaces of the package substrate 300. The lower and upper pads 312 and 311 and the redistribution circuit 313 may form one or more electrical path(s) variously connecting the lower surface and the upper surface of the package substrate 300. External connection terminals 320 respectively connected to lower pads 312 may be disposed below the package substrate 300. The external connection terminals 320 may be formed of a conductive material having a ball or a pin shape.

Figure 14:
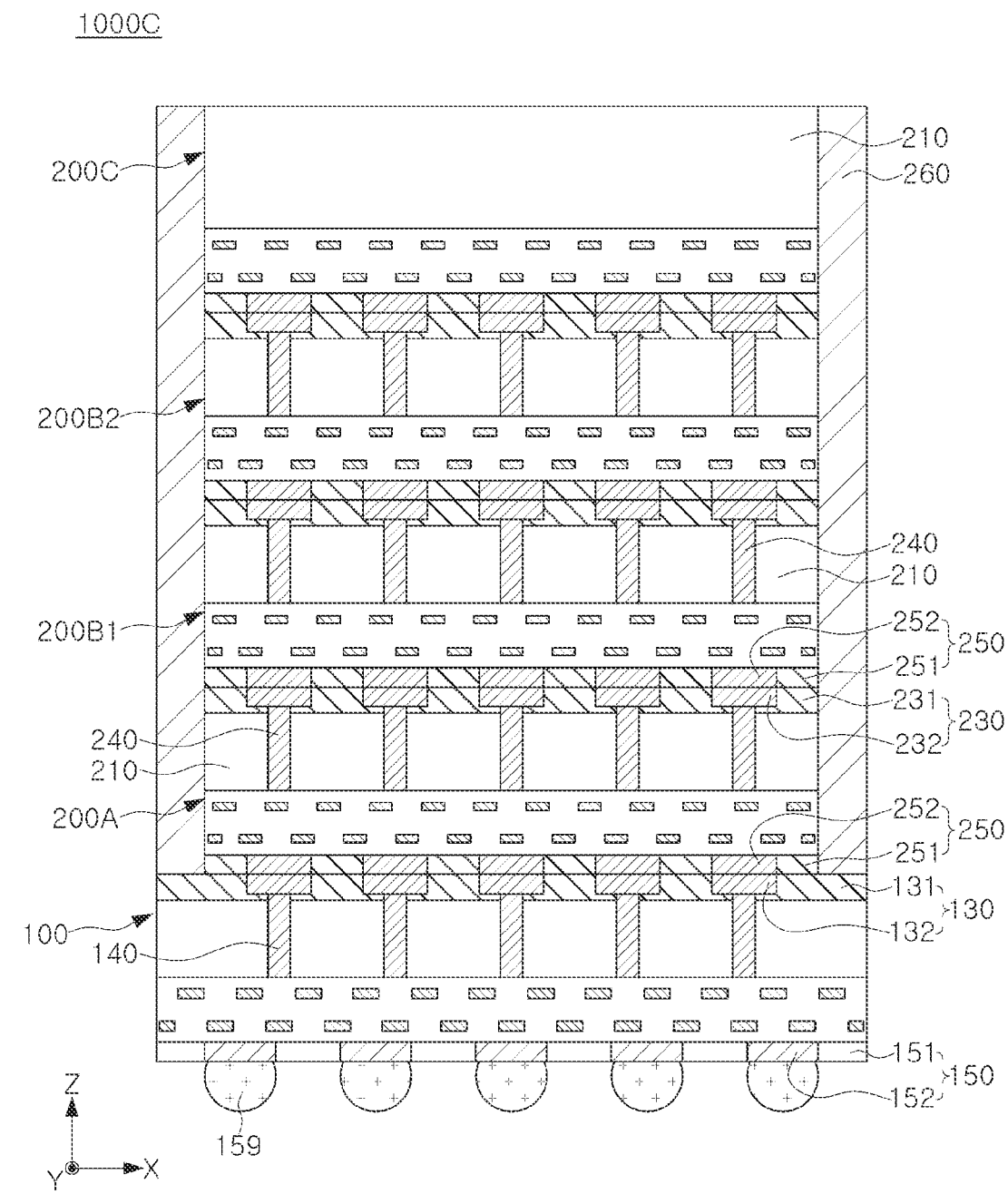

FIG. 14 is a cross-sectional view of a semiconductor package 1000C according to embodiments of the inventive concept.

Referring to FIG. 14, the semiconductor package 1000C may be substantially similar to the semiconductor package 1000 of FIGS. 1, 2 and 3, except that the dishing phenomenon is avoided and the semiconductor structure 100 is provided as a stacked plurality of semiconductor chips 200A, 200B1, 200B2, and 200C.

The semiconductor package 1000C may further include an encapsulant 260 covering the semiconductor chips 200A, 200B1, 200B2, and 200C on the semiconductor structure 100. The encapsulant 260 may expose an upper surface of the third semiconductor chip 200C, but may also cover an upper surface of the third semiconductor chip 200C according to an example embodiment. In some embodiments, the encapsulant 260 may include, for example, an epoxy mold compound (EMC). Any reasonable number of semiconductor chips 200A, 200B1, 200B2, and 200C may be used.

The semiconductor chips 200A, 200B1, 200B2, and 200C may include a lowermost semiconductor chip 200A attached to an upper surface of the semiconductor structure 100, one or more intervening semiconductor chips 200B1 and 200B2 sequentially stacked on the first semiconductor chip 200A, and an uppermost semiconductor chip 200C stacked on the second chips 200B1 and 200B2. Here, each of the semiconductor chips 200A, 200B1, 200B2, and 200C may include a first bonding structure 230 and a second bonding structure 250, and a hybrid bonding structure may be formed between the lowermost semiconductor chip 200A and the semiconductor structure 100, as well as between an intervening semiconductor chip 200B1 and 200B2 and the third semiconductor chip 200C. The lowermost semiconductor chip 200A and the intervening semiconductor chips 200B1 and 200B2 may further include a second through-via 240, wherein the second through-via 240 may include a through-electrode and a barrier layer. The through-electrode and barrier layer of the second through-via 240 may be substantially similar to the through-electrode 142 and the barrier layer 141 of FIG. 3.

As one example, the semiconductor structure 100 may be a buffer chip including logic devices and/or memory devices. Accordingly, the semiconductor structure 100 may communicate (e.g., transmit and/or receive) signals (e.g., power, data address, command, and/or control signals) from the vertically stacked semiconductor chips 200A, 200B1, 200B2, and 200C to one or more external circuits. The semiconductor structure 100 may perform both logic functions and memory functions using the logic devices and the memory devices. In some embodiments, the semiconductor structure 100 may include only logic devices to perform only logic functions. The semiconductor chips 200A, 200B1, 200B2, and 200C may include, for example, volatile memory chips such as a DRAM and an SRAM, or nonvolatile memory chips such as a PRAM, an MRAM, an FeRAM, or an RRAM. For example, the semiconductor package 1000B in the present embodiment may be used in a high bandwidth memory (HBM) product, an electro-data processing (EDP) product, or the like.

Figure 15:
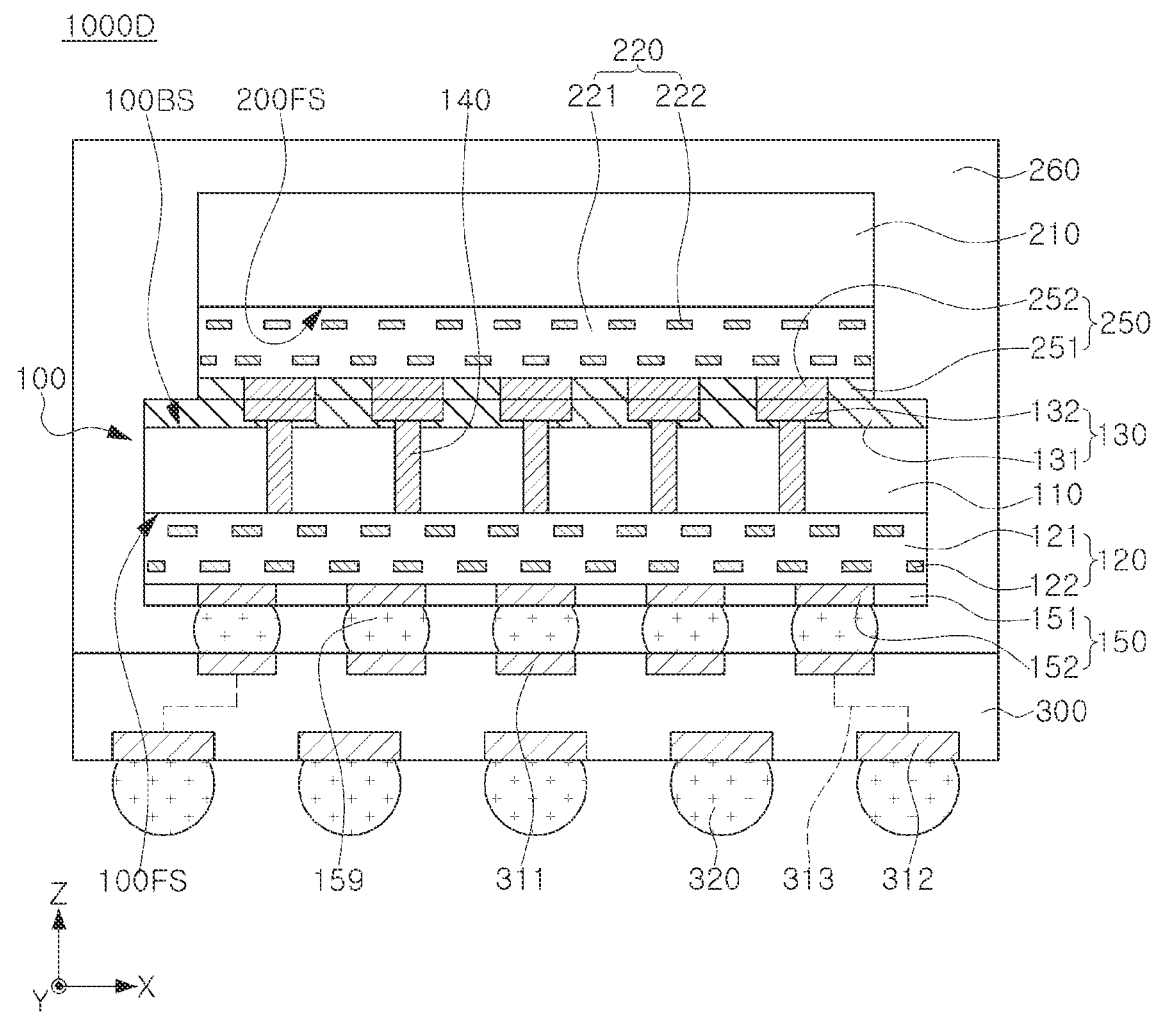

FIG. 15 is a cross-sectional view of a semiconductor package 1000D according to embodiments of the inventive concept.

Referring to FIG. 15, the semiconductor package 1000D may be substantially similar to the semiconductor package 1000 of FIGS. 1 to 3, except that the dishing phenomenon is avoided and semiconductor package 1000D further includes; a package substrate 300 on which a semiconductor structure 100 is mounted, and an encapsulant 260 encapsulating the semiconductor structure 100 and a semiconductor chip 200 on the package substrate 300.

As one example, the semiconductor structure 100 may be a logic chip including, for example, a central processing unit (CPU), a graphics processing unit (GPU), a field programmable gate array (FPGA), an application processor (AP), a digital signal processor (DSP), or a cryptographic processor, a microprocessor, a microcontroller, an analog-to-digital converter, an application-specific integrated circuit (ASIC), etc. The semiconductor chip 200 may include a memory chip such as a DRAM, an SRAM, a PRAM, an MRAM, an FeRAM, or an RRAM. In some embodiments, the semiconductor chip 200 may be substantially similar to the semiconductor chip 200 described in relation to FIG. 2, albeit avoiding the dishing phenomenon and having a shape substantially similar to that described in relation to FIGS. 13 and 14. As one example, the semiconductor chip 200 may include a power management integrated circuit (IC) (or PMIC) chip.

As described above, the provision of the blocking layer may protect the surface of a bonding pad from becoming locally overly-etched (e.g., dishing) during a planarization operation associated with a damascene process. In addition, the blocking layer may be removed with a barrier layer using a subsequently applied wet etching process, thereby avoiding dishing of an insulating layer. As a result, a semiconductor package having improved performance characteristics and improved reliability may be provided.

While example embodiments have been shown and described above, it will be apparent to those skilled in the art that modifications and variations could be made without departing from the scope of the present inventive concept as defined by the appended claims.

What is claimed is:
1. A method of manufacturing a semiconductor package, the method comprising:
preparing a semiconductor structure including a semiconductor layer and a through-via penetrating through the semiconductor layer;
forming an insulating layer on the semiconductor structure;
forming an opening in the insulating layer to expose an upper surface of the through-via;
forming a barrier layer on the insulating layer to cover the upper surface of the through-via, inner side surfaces of the opening, and an upper surface of the insulating layer;
forming a metallic material layer on the barrier layer, wherein the metallic material layer includes a concave portion and a non-concaved portion;
forming a blocking layer on the metallic material layer, wherein the blocking layer includes a first portion covering the concaved portion of the metallic material layer and a second portion covering the non-concaved portion of the metallic material layer;
performing a first planarization process to remove the second portion of the blocking layer, while the first portion of the blocking layer remains;
performing a second planarization process to remove the non-concaved portion of the metallic material layer and expose the barrier layer on the insulating layer; and
performing a wet etching process to remove the barrier layer on the insulating layer and the first portion of the blocking layer, wherein a recessed portion below an upper surface of the metallic material layer is formed in the barrier layer during the wet etching process.

2. The method of claim 1, wherein the barrier layer and the blocking layer includes a material having an etching selectivity with respect to the metal material layer and the insulating layer.

3. The method of claim 1, wherein the barrier layer on the insulating layer and the first portion of the blocking layer are simultaneously removed by the wet etching process.

4. The method of claim 1, wherein a portion of a side surface of the insulating layer and a side surface of the metallic material layer opposing the portion of the side surface of the insulating layer are exposed by the wet etching process.

5. The method of claim 1, wherein a depth of the recessed portion of the barrier layer is greater than or equal to a thickness of the barrier layer.

6. The method of claim 1, wherein the barrier layer has a thickness ranging from about 100 nm to about 200 nm, and
a depth of the recessed portion of the barrier layer is about 300 nm or less.

7. The method of claim 1, wherein a portion of a surface of the metallic material layer below the first portion of the blocking layer is not exposed by the second planarization process.

8. The method of claim 1, wherein after performing the wet etching process, the barrier layer and the metallic material layer constitute a lower bonding pad, and the method further comprises:
bonding a semiconductor chip including an upper bonding pad to the semiconductor structure by directly bonding the lower bonding pad and the upper bonding pad.

9. The method of claim 8, wherein the upper bonding pad includes an upper barrier layer and an upper metallic material layer,
the upper metallic material layer and the metallic material layer of the lower bonding pad are directly bonded, and
the upper barrier layer includes a portion recessed upwardly to be higher than a lower surface of the upper metallic material layer.

10. The method of claim 9, wherein the barrier layer of the lower bonding pad and the upper barrier layer of the upper bonding pad are spaced apart from each other.

11. The method of claim 1, wherein a surface of the non-concaved portion of the metallic material layer disposed on the insulating layer is exposed by the first planarization process.

12. The method of claim 1, wherein the insulating layer includes a first insulating layer, a second insulating layer, and a third insulating layer sequentially stacked on the semiconductor layer,
the second insulating layer includes a second material different from a first material of the first insulating layer and different from a third material of the third insulating layer, and
the first insulating layer includes a portion extending between the second insulating layer and a side surface of the through-via.

13. The method of claim 12, wherein the opening exposes the upper surface of the through-via, an upper surface of the first insulating layer, and an upper surface of the second insulating layer.

14. A method of manufacturing a semiconductor package, the method comprising:
forming a first structure including a first bonding structure including a first bonding pad;
forming a second structure including a second bonding structure including a second bonding pad; and
bonding the first structure and the second structure, such that the first bonding structure is directly bonded to the second bonding structure,
wherein the forming of the first structure includes:
preparing a semiconductor structure including a semiconductor layer and a through-via penetrating the semiconductor layer;
forming an insulating layer on the semiconductor layer;
forming an opening in the insulating layer exposing an upper surface of the through-via;
forming a barrier layer on the insulating layer to cover the upper surface of the through-via, inner side surfaces of the opening and an upper surface of the insulating layer;
forming a metallic material layer on the barrier layer, wherein the metallic material layer includes a concave portion and a non-concaved portion;
forming a blocking layer on the metallic material layer, wherein the blocking layer includes a first portion covering the concaved portion of the metallic material layer and a second portion covering the non-concaved portion of the metallic material layer;
performing a first planarization process to remove the second portion of the blocking layer, while the first portion of the blocking layer remains;
performing a second planarization process to remove the non-concaved portion of the metallic material layer and expose the barrier layer on the insulating layer;
performing a wet etching process to remove the barrier layer on the insulating layer and the blocking layer to form the first bonding pad including the barrier layer in the opening and the metallic material layer; and
forming a recessed portion below an upper surface of the metallic material layer on the barrier layer while removing the barrier layer on the insulating layer.

15. The method of claim 14, wherein the barrier layer and the blocking layer include a material having an etching selectivity with respect to the metallic material layer and the insulating layer.

16. The method of claim 14, wherein the barrier layer and the blocking layer include at least one of titanium (Ti), titanium nitride (TiN), tantalum (Ta), and tantalum nitride (TaN).

17. The method of claim 14, wherein a first processing time associated with the performing of the first planarization process is shorter than a second processing time associated with the performing of the second planarization process.

18. The method of claim 14, wherein the first bonding structure further includes a first bonding insulating layer surrounding at least a portion of a side surface of the first bonding pad,
the second bonding structure further includes a second bonding insulating layer surrounding at least a portion of a side surface of the second bonding pad,
the first bonding pad and the second bonding pad are directly bonded by copper-to-copper bonding, and
the first bonding insulating layer and the second bonding insulating layer are directly bonded by dielectric-to-dielectric bonding.

19. The method of claim 14, wherein the bonding of the first structure and the second structure includes at least one of die-to-die bonding, die-to-wafer bonding, and wafer-to-wafer bonding.

20. A method of manufacturing a semiconductor package, the method comprising:
forming a first structure including a first bonding structure including a first bonding pad;
forming a second structure including a second bonding structure including a second bonding pad; and
bonding the first structure and the second structure, such that the first bonding structure is directly bonded to the second bonding structure,
wherein at least one of the forming of the first structure and the forming of the second structure includes:
preparing a semiconductor structure including a semiconductor layer and a through-via penetrating the semiconductor layer;
forming an insulating layer on the semiconductor layer;
forming an opening in the insulating layer exposing an upper surface of the through-via;
forming a barrier layer on the insulating layer to cover the upper surface of the through-via, inner side surfaces of the opening and an upper surface of the insulating layer;
forming a metallic material layer on the barrier layer, wherein the metallic material layer includes a concave portion and a non-concaved portion;
forming a blocking layer on the metallic material layer, wherein the blocking layer includes a first portion covering the concaved portion of the metallic material layer and a second portion covering the non-concaved portion of the metallic material layer;
performing a first planarization process to remove the second portion of the blocking layer, while the first portion of the blocking layer remains;
performing a second planarization process to remove the non-concaved portion of the metallic material layer and expose the barrier layer on the insulating layer;
performing a wet etching process to remove the barrier layer on the insulating layer and the blocking layer to form the first bonding pad including the barrier layer in the opening and the metallic material layer,
a recessed portion is formed in the barrier layer while removing the barrier layer on the insulating layer, and a first recessed portion in a first barrier layer of the first bonding pad and a second recessed portion in a second barrier layer of the second bonding pad are respectively spaced apart from a bonding surface between the first bonding pad and the second bonding pad.

\* \* \* \* \*